(12) United States Patent
Fujimaru et al.

(10) Patent No.: US 8,653,202 B2
(45) Date of Patent: Feb. 18, 2014

(54) ADHESIVE COMPOSITION FOR SEMICONDUCTOR, SEMICONDUCTOR DEVICE MAKING USE OF THE SAME AND PROCESS FOR PRODUCING SEMICONDUCTOR DEVICE

(75) Inventors: Koichi Fujimaru, Hikone (JP); Toshihisa Nonaka, Otsu (JP)

(73) Assignee: TORAY Industries, Inc., Tokyo (JP)

( * ) Notice: Subject to any disclaimer, the term of this patent is extended or adjusted under 35 U.S.C. 154(b) by 835 days.

(21) Appl. No.: 11/921,560

(22) PCT Filed: Jun. 5, 2006

(86) PCT No.: PCT/JP2006/311184
§ 371 (c)(1), (2), (4) Date: Mar. 26, 2008

(87) PCT Pub. No.: WO2006/132165
PCT Pub. Date: Dec. 14, 2006

(65) Prior Publication Data
US 2009/0123747 A1    May 14, 2009

(30) Foreign Application Priority Data
Jun. 6, 2005   (JP) ................. 2005-165287

(51) Int. Cl.
| | | |
|---|---|---|
| C08G 69/26 | (2006.01) |
| C08F 8/00 | (2006.01) |
| C08L 63/00 | (2006.01) |
| C08L 61/04 | (2006.01) |
| C08L 69/00 | (2006.01) |
| C08F 283/04 | (2006.01) |
| C08G 69/48 | (2006.01) |
| C08G 73/10 | (2006.01) |
| C08L 77/00 | (2006.01) |
| C08L 79/08 | (2006.01) |

(52) U.S. Cl.
USPC ........... 525/423; 525/422; 525/107; 525/109; 525/111; 525/113; 528/335

(58) Field of Classification Search
None
See application file for complete search history.

(56) References Cited

U.S. PATENT DOCUMENTS

| 7,476,476 B2 * | 1/2009 | Suwa ............................ 430/18 |
| 2001/0016372 A1 | 8/2001 | Murakami .................. 438/113 |

(Continued)

FOREIGN PATENT DOCUMENTS

| EP | 1 630 605 A1 | 3/2006 |
| JP | 11-220051 A | 8/1999 |

(Continued)

OTHER PUBLICATIONS

Machine translation JP 2004-292821 (2004).*

(Continued)

*Primary Examiner* — Alicia Chevalier
*Assistant Examiner* — Frank D Ducheneaux
(74) *Attorney, Agent, or Firm* — Kubovcik & Kubovcik

(57) ABSTRACT

An adhesive composition for semiconductor containing an organic-solvent-soluble polyimide (a), an epoxy compound (b) and a hardening accelerator (c), wherein per 100 wt parts of the epoxy compound (b), there are contained 15 to 90 wt parts of the organic-solvent-soluble polyimide (a) and 0.1 to 10 wt parts of the hardening accelerator (c), wherein the epoxy compound (b) contains a compound being liquid at 25° C. under $1.013\times10^5$ N/m² and a compound being solid at 25° C. under $1.013\times10^5$ N/m², and wherein a ratio of compound being liquid based on all the epoxy compounds is 20 wt % or more and 60 wt % or less.

5 Claims, 2 Drawing Sheets

(56) References Cited

U.S. PATENT DOCUMENTS

| | | |
|---|---|---|
| 2004/0105990 A1 * | 6/2004 | Shiobara et al. ........... 428/473.5 |
| 2004/0132888 A1 | 7/2004 | Naiki et al. ................... 524/449 |
| 2004/0213994 A1 | 10/2004 | Kozakai et al. ............... 428/354 |

FOREIGN PATENT DOCUMENTS

| | | |
|---|---|---|
| JP | 2003-192894 A | 7/2003 |
| JP | 2004-137411 A | 5/2004 |
| JP | 2004-146495 A | 5/2004 |
| JP | 2004-292821 A | 10/2004 |
| JP | 2004-315688 A | 11/2004 |
| JP | 2004-319823 A | 11/2004 |
| JP | 2005-183855 A | 7/2005 |
| JP | 2005-332901 A | 12/2005 |
| TW | 200427807 A | 12/2004 |
| WO | WO 2004109403 A1 * | 12/2004 |

OTHER PUBLICATIONS

Derwent abstract JP 2004-292821 (2004).*
Human translation of JP 2004137411 A (2004).*

* cited by examiner

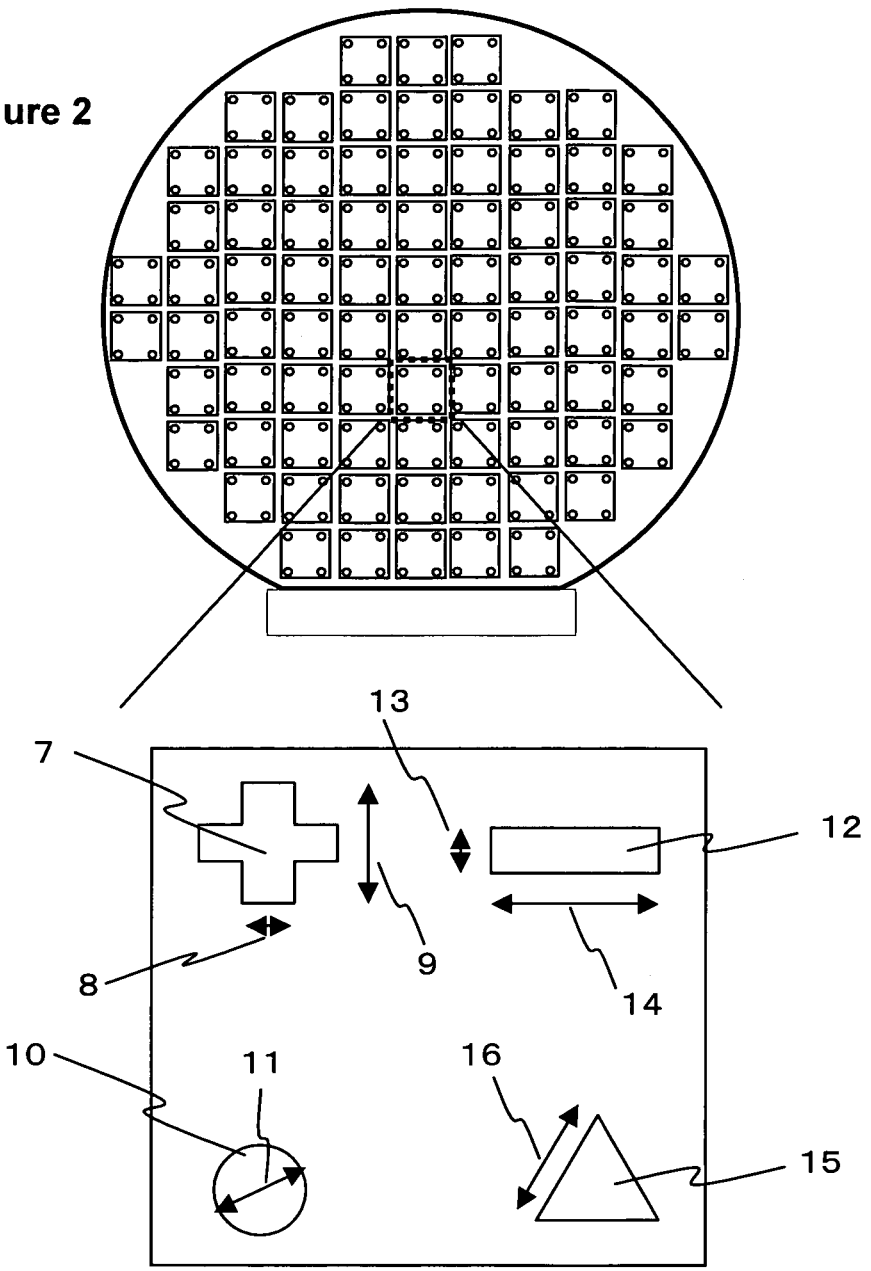

ADHESIVE COMPOSITION FOR SEMICONDUCTOR, SEMICONDUCTOR DEVICE MAKING USE OF THE SAME AND PROCESS FOR PRODUCING SEMICONDUCTOR DEVICE

TECHNICAL FIELD

The present invention relates to an adhesive composition for semiconductor for, after forming the adhesive composition for semiconductor on a semiconductor wafer, directly and electrically bonding a semiconductor chip such as IC or LSI, which is made by singulation of the wafer with the adhesive composition for semiconductor by dicing, to a circuit substrate such as a flexible substrate, a glass/epoxy substrate, a glass substrate or a ceramic substrate, and a semiconductor device making use of the same and a production method of the semiconductor device.

BACKGROUND ART

In recent years, accompanied by downsizing and high densification of semiconductor device, as a method of mounting semiconductor chip on a circuit substrate, flip chip assembly (direct chip attach assembly) has drawn attention and has been spreading widely. In the flip chip assembly, as a method of keeping connection reliability of bonding portion, it is adopted as a general method, after bonding bump electrodes built on the semiconductor chip to pad electrodes of circuit substrate, to inject a liquid encapsulant into a gap between the semiconductor chip and the circuit substrate. However, for making semiconductor device small and light, due to increased number of bump electrodes built on the semiconductor chip and low profiling requirement of the bump electrode, there appeared some cases in which it is impossible to adopt conventional method to inject the liquid encapsulant into a gap between the semiconductor chip and the circuit substrate sufficiently to keep connection reliability of the bonding portion. To this problem, it has become being adopted that the semiconductor chip and the circuit substrate are bonded after coating a liquid adhesive called as underfill material to the semiconductor chip with circuit substrate or bump electrode by a method such as dispenser or screen printing. However, since it was difficult to uniformly coat the liquid adhesive in micro area, there were problems, due to flowing out of the liquid adhesive, that such as contamination of the circuit substrate or the semiconductor chip, expansion of assembling area and existence of unsealed portions (see Patent reference 1).

In order to solve this problem, a method of simultaneously carrying out an electrical bonding and resin sealing by, after laminating an adhesive composition for semiconductor of a predetermined thickness to a semiconductor wafer provided with bump electrodes, making the semiconductor wafer into singulated semiconductor chips by dicing, and then, flip chip connecting the semiconductor chips to a circuit substrate (see Patent reference 2) and an adhering film for using thereto were proposed. In this method, it is possible to make the adhering areas of the adhesive composition for semiconductor and of the semiconductor chip substantially equal and, compared to a case in which a liquid encapsulant is used, flowing out of the adhesive composition from the semiconductor chip is very little (see Patent references 3 and 4). However, the adhesive composition for semiconductor used in Patent references 3 and 4 are those composed of a phenoxy resin having fluorene skeleton, an epoxy resin, a micro-capsulated imidazole derivative epoxy compound and a filler, or those composed of an organic-solvent-soluble polyimide, an epoxy resin, a phenol resin and an inorganic filler. Since these contain a much amount of inorganic filler or micro capsule, its light transmittance is low and detection of alignment marks on semiconductor chip cannot be done, which is carried out when the dicing is carried out and when the flip chip bonding of semiconductor chip after dicing is carried out. Further, in case where an alignment is carried out based on a position detection of the bump electrode, instead of alignment marks, the position detection of the bump electrode is also difficult.

In case where the thickness of adhesive composition layer for semiconductor formed on the semiconductor chip is less than the thickness of the bump electrode, position detection of the bump electrode becomes possible, but since a bad connection is caused in case where the thickness of adhesive composition layer for semiconductor is less than the thickness of bump electrode, it can be used only when the thickness of adhesive composition layer for semiconductor and the thickness of bump electrode are substantially same. Further, since number of bump electrodes on semiconductor wafer is very large, it is very difficult to adjust the thickness of adhesive composition layer for semiconductor with every bump electrode height. Furthermore, there are various shapes as the bump electrode such as plate-like, cylindrical, hemispheric, mushroom-like, protuberant, and in those of hemispheric, mushroom-like and protuberant, in case where the thickness of adhesive composition layer for semiconductor and the thickness of bump electrode are same, since detectable area becomes small, detection becomes extremely difficult. Further, in other than those containing an inorganic filler or micro capsule, compositions having an island structure of several micron size due to a low compatibility between resins (so-called composition of sea-island structure), for example, in mixed systems of an epoxy resin and NBR (acrylonitrile-butadiene copolymer) or the like, a light transmittance becomes low and problems similar to the above-mentioned arise.

Furthermore, when a dicing is carried out after the liquid encapsulant described in Patent reference 1 is coated on the bump electrode surface side of the semiconductor wafer, several problems may occur such as a problem that a dicing dust is apt to stick to liquid encapsulant, that the liquid encapsulant sticks to wafer edge surface due to high flowability of liquid encapsulant or a problem of clogging of dicing blade, or a problem of roughening of film surface caused by water ejecting pressure. For that reason, it is difficult to industrially adopt the process that dicing is carried out after coating the liquid encapsulant described in Patent reference 1 on bump electrode surface side of the semiconductor wafer. Further, when the dicing is carried out after laminating adhesive composition for semiconductor described in Patent references 3 and 4 on surface of bump electrode of the semiconductor wafer, there are problems that dicing dust is apt to stick to the liquid encapsulant, that a delamination of the liquid encapsulant from the wafer, or a defect or crack of the liquid encapsulant is caused. Although the defect or crack of the liquid encapsulant can be improved to a certain extent by decreasing the speed of cutting, when the recent situation in which wafer diameter enlargement is going on is considered, decreasing of dicing speed becomes a factor of cost up. Furthermore, in the adhesive composition for semiconductor described in Patent reference 3, a phenoxy resin having a fluorene skeleton or an organic-solvent-soluble polyimide is used to add a heat-resistance, but it has not a sufficient heat resistance or insulating property as an adhesive composition to coat the semiconductor wafer provided with bump electrodes.

On the other hand, in Patent reference 5, a method of combining an epoxy resin excellent in compatibility with polyimide and an organic-solvent-soluble polyimide is disclosed. By applying this method, an adhesive sheet of a high light transmittance can be obtained. However, it has a very brittle property since a solid epoxy resin is used as the epoxy resin, and when dicing is carried out after laminating to semiconductor wafer provided with bump electrodes, delamination from the wafer, or defect or crack of the adhesive itself is caused.

Further, a method of mixing a solid epoxy resin which is solid at room temperature and an epoxy resin which is liquid at room temperature to give flexibility has been known (see Patent reference 6). However, when a dicing is carried out after forming an adhesive layer consisting of these resins on a semiconductor wafer provided with bump electrodes, there are problems of delamination of the adhesive composition for semiconductor from the wafer, or that a defect or crack of the adhesive composition for semiconductor occurs.

Furthermore, an adhesive sheet which contains a polyimide, an epoxy resin of 3 functional or more and a liquid epoxy resin is also disclosed (see Patent reference 7). However, when a flip chip assembly is carried out by using the adhesive sheet containing polyimide described in Patent reference 7, since water absorbability of this polyimide is high, the water stored by the absorption in the adhesive sheet evaporates rapidly by being heated at the time of mounting, and accordingly, the adhesive sheet foams, and problems arise such as that the adhesive strength between semiconductor chip and circuit substrate cannot sufficiently be obtained, or that the connection reliability becomes low.

Further, as organic-solvent-soluble polyimide, a polyimide having a reactive group such as phenolic hydroxyl group at main chain end of the polymer (see Patent reference 8) has been known.

[Patent reference 1] Specification of US2004/132888,A
[Patent reference 2] Specification of US2001/16372,A
[Patent reference 3] JP2004-315688,A (scope of claims)
[Patent reference 4] JP2004-319823,A (scope of claims)
[Patent reference 5] JP2003-192894,A (Claim 1)
[Patent reference 6] JP2004-146495,A (Claim 11, column 39)
[Patent reference 7] JP2004-292821,A (scope of claims, column 73)
[Patent reference 8] Specification of EP1630605,A The present invention provides, in order to solve the above-mentioned problems, an adhesive composition for semiconductor which does not cause crack or delamination even when being flexed, which can be laminated to bump electrode side of semiconductor wafer provided with bump electrodes of a narrow pitch and a high pin count, which permits a high-speed cutting without a contamination with dicing dust and without a defect at the time of dicing, and which is excellent in detection of alignment marks at the times of dicing and flip chip assembly. And, this invention provides an adhesive composition for semiconductor which is possible to highly precisely metallic bond a highly precisely cut semiconductor chip to an electrode pad of circuit substrate via bumps, or by being able to achieve a stable electric conduction by contact between conductive materials, and by functioning as an adhesive which gives a shrinking stress between the semiconductor chip and the circuit substrate, which assists stable electric conduction by this metallic bonding between the electric conductive materials and functions to enhance reliability of the connection.

SUMMARY OF THE INVENTION

That is, the present invention is an adhesive composition for semiconductor comprising an organic-solvent-soluble polyimide (a), an epoxy compound (b) and a hardening accelerator (c), wherein, per 100 wt parts of epoxy compound (b), there are contained 15 to 90 wt parts of the organic-solvent-soluble polyimide (a) and 0.1 to 10 wt parts of the hardening accelerator (c), wherein the epoxy compound (b) contains a compound being liquid at 25° C. under $1.013 \times 10^5$ N/m$^2$ and a compound being solid at 25° C. under $1.013 \times 10^5$ N/m$^2$, and wherein a ratio of the epoxy compound being liquid based on all the epoxy compounds is in the range of 20 wt % or more and 60 wt % or less.

By the composition of the present invention, it is possible to laminate it to the bump electrode side of semiconductor wafer provided with bump electrodes without void, it is possible, at the time of dicing, to cut at high speed without contamination with dicing dust or defect of the adhesive layer, and the detection of alignment marks at the time of flip chip assembly is easy. Further, using the composition and the production method of the present invention, it is possible to highly precisely metal bond a highly precisely cut semiconductor chip to an electrode pad of circuit substrate via a bump, or to achieve a stable conduction by contact between conductive materials, and by exhibiting a shrinking stress between the semiconductor chip and the circuit substrate, it is possible to obtain a semiconductor device excellent in reliability. Further, according to the production method of the present invention, it is possible to minimize the mounting area since an amount of flowing out of the adhesive which is used for connecting between the semiconductor chip and the substrate is small, and it is possible to make the semiconductor chip thin and to simplify the mounting process to the circuit substrate.

EXPLANATION OF CODES

Figure 1:
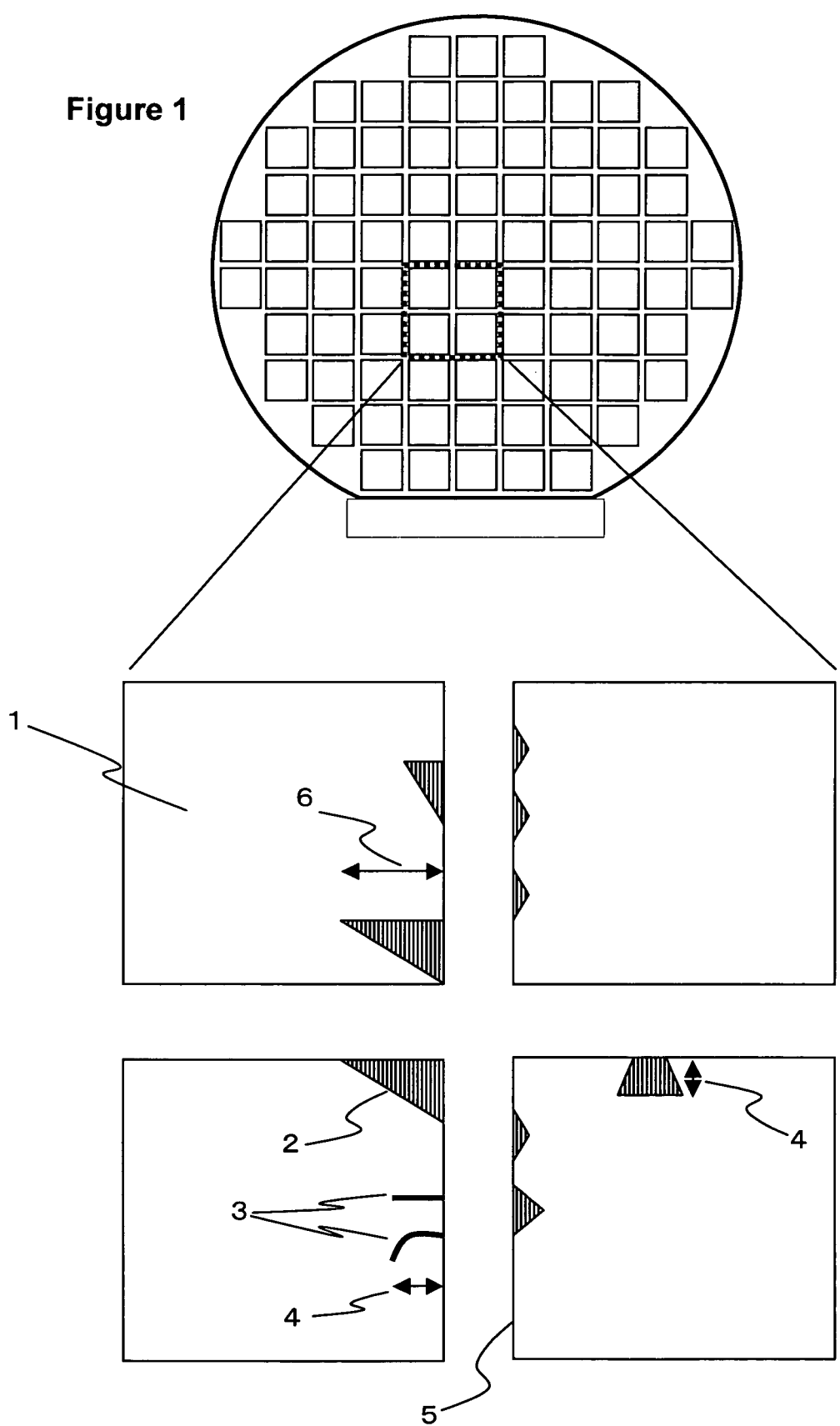
FIG. 1 A schematic diagram of the semiconductor wafer provided with the adhesive composition for semiconductor after dicing FIG. 2 A schematic diagram of the alignment marks on wafer

1 A portion of the semiconductor wafer-coated with the composition
2 crack defect portion of the composition
3 Crack
4 Length of defect portion
5 Diced edge
6 Length of the largest defect portion
7 Crossed alignment mark
8 Thickness of character (20 μm)
9 Length of character (140 μm)
10 Circular alignment mark
11 Diameter (100 μm)
12 Square alignment mark
13 Short side length of square (10 μm)
14 Long side length of square (50 μm)
15 Alignment mark of equilateral triangle
16 Side length of equilateral triangle (30 μm)

DETAILED DESCRIPTION OF THE INVENTION

The adhesive composition of the present invention is an adhesive composition for semiconductor comprising an organic-solvent-soluble polyimide (a), an epoxy compound (b) and a hardening accelerator (c), and has a light transmittance of 70% or more, wherein, per 100 wt parts of the epoxy compound (b), there are contained 15 to 90 wt parts of the organic-solvent-soluble polyimide (a) and 0.1 to 10 wt parts of the hardening accelerator (c), wherein the epoxy compound (b) contains a compound being liquid at 25° C. under $1.013\times10^5$ N/m² and a compound being solid at 25° C. under $1.013\times10^5$ N/m², and wherein a ratio of the epoxy compound being liquid based on all the epoxy compounds is in the range of 20 wt % or more and 60 wt % or less.

The organic-solvent-soluble polyimide (a) used in the present invention should at least be soluble in organic solvent and its structure or the like is not especially limited. The "soluble" means that 20 wt % or more is soluble at 23° C. in the solvents selected below. Those are acetone, methyl ethyl ketone, methyl isobutyl ketone, cyclopentanone and cyclohexanone which are ketone-based solvents, 1,4-dioxane, tetrahydrofuran and diglyme which are ether-based solvents, methyl cellosolve, ethyl cellosolve, propylene glycol monomethyl ether, propylene glycol monoethyl ether, propylene glycol monobutyl ether and diethylene glycol methyl ethyl ether which are glycol ether-based solvents, and other than that, benzyl alcohol, N-methyl pyrrolidone, γ-butyrolactone, ethyl acetate and N,N-dimethyl formamide are mentioned.

The adhesive composition for semiconductor of the present invention is excellent in heat resistance and chemical resistance since it contains the organic-solvent-soluble polyimide (a) having an imide ring. In particular, as the organic-solvent-soluble polyimide, by using those having at least one functional group capable of reacting with the epoxy group both in its side chain and in the molecular end, a ring-opening of the epoxy compound and an addition reaction to aromatic polyimide are accelerated at the time of heat treatment, and it becomes possible to obtain a composition having a still higher density network structure. As the functional group capable of reacting with the epoxy group, a phenolic hydroxyl group, a sulfonic acid group and a thiol group are mentioned. As synthesis method of such an aromatic polyimide, for example, a method in which, first, a polyimide precursor is synthesized by reacting an acidic dianhydride, having a group capable of reacting with the epoxy group, with a diamine, next, by using a primary monoamine or a carboxylic acid derivative having a group capable of reacting with epoxy group as an end capping agent, an end modification of this polyimide precursor is carried out, and subsequently, it is heat treated at 150° C. or more to carry out a polyimide cyclization, is mentioned. Or, it can be obtained by, after reacting an acidic dianhydride and, as an end capping agent, a primary monoamine beforehand, and adding a diamine to synthesize an end modificated polyimide precursor, and furthermore, carrying out polyimide cyclization at 150° C. or more. Or, it can be obtained by, after reacting diamine and, as an end capping agent, a carboxylic acid derivative beforehand, and adding an acidic dianhydride to synthesize an end modificated polyimide precursor, furthermore, carrying out polyimide cyclization at 150° C. or more.

To make the organic-solvent-soluble polyimide (a) used in the present invention soluble in the above-mentioned solvent, it is preferable that the main chain of the polyimide or aromatic polyimide containing aliphatic structure or alicyclic structure is changed to that having at least one group selected from the group consisting of 1,1,1,3,3,3-hexafluoropropyl group, isopropyl group, ether group, thioether group, and $SO_2$ group. Such aromatic polyimides can be obtained by using a diamine component or an acidic dianhydride component having 1,1,1,3,3,3-hexafluoropropyl group, isopropyl group, ether group, thioether group, or $SO_2$ group. It is preferable that the amount of the polyimide having such a group is, per total amount of the polyimide, 80 wt % or more, in order to make solubility high. And, it is preferable that the molecular end of aromatic polyimide is end-capped with an end capping agent consisting of a monoamine and/or a carboxylic acid derivative.

In the present invention, among the organic-solvent-soluble polyimide (a), a polymer having a structure represented by any one of the general formulas (2) to (7) and having at least one functional group capable of reacting with the epoxy group both in its side chain and in the molecular end, and having a structure represented by the general formula (1) as $R^4$ of the general formulas (2) to (7), in an amount of 2 to 15 wt % per total amount of the polymer, is preferably used. Here, the "total amount of the polymer (polyimide)" obtainable by synthesis of the organic-solvent-soluble polyimide mentioned here is the weight obtained by the polymerization of the constituting component consisting of the primary amine compound, the acidic dianhydride and the end capping agent, and an excessively fed primary amine compound, acidic dianhydride and end capping agent at the synthesis are not contained as the weight of the polyimide.

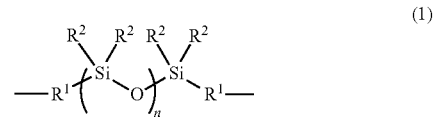

In the formula, $R^1$ denotes a divalent hydrocarbon group, $R^2$ denotes a monovalent hydrocarbon group, and they may be same or different. n denotes an integer of 1 to 10. It is not necessary that each $R^2$ has the same structure when more than one $R^2$ are contained in a molecule.

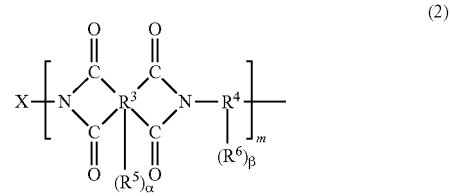

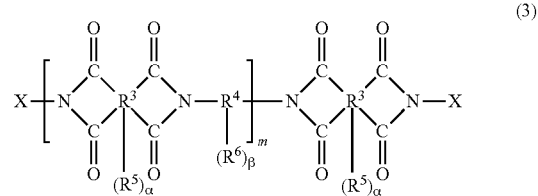

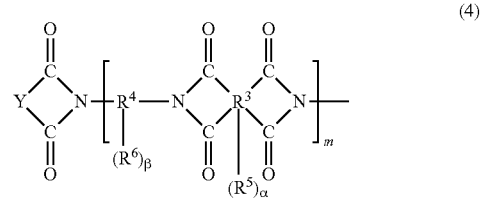

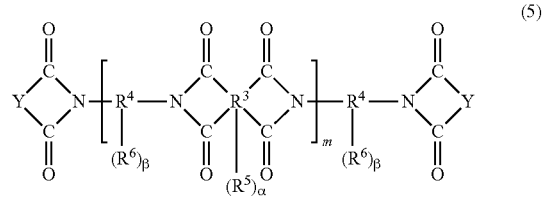

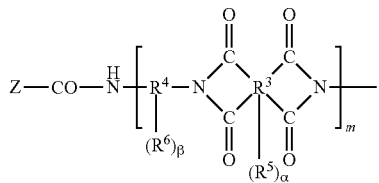

(6)

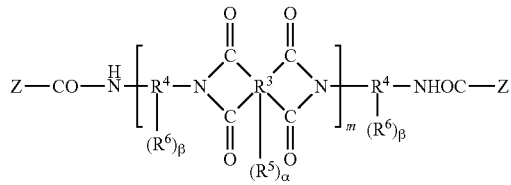

(7)

In the formula, $R^3$ is a 4 to 14-valent organic group, $R^4$ is a 2 to 12-valent organic group, at least one of $R^3$ and $R^4$ contains at least one group selected from the group consisting of 1,1,1,3,3,3-hexafluoropropyl group, isopropyl group, ether group, thioether group and $SO_2$ group. $R^5$ and $R^6$ denote organic groups containing at least one group selected from the group consisting of phenolic hydroxyl group, sulfonic acid group and thiol group, and they may be same or different. X denotes a monovalent organic group, Y denotes a divalent organic group and Z denotes a monovalent organic group. m denotes the range of 8 to 200. α and β denote integers of 0 to 10, respectively, α+β is an integer of 1 to 10.

In the organic-solvent-soluble polyimide (a) used in the present invention, by containing a structure represented by the general formula (1), its solubility to the above-mentioned solvent is improved and it is possible to suppress its shrinkage at hardening.

In the general formula (1), $R^1$ denotes a divalent hydrocarbon group, and preferably, it is an alkylene group with 1 to 5 carbons or a phenylene group. N denotes an integer of 1 to 10, and it preferably is 1 to 2. By making n 1 or more, it is possible to suppress shrinkage at the time of hardening, and by making 10 or less, it is possible to improve insulation and heat resistance without decreasing imide group content in the polyimide skeleton. $R^2$ denotes a monovalent hydrocarbon group, and it preferably is an alkyl group with 1 to 5 carbons or a phenyl group. Further, it is not necessary that each $R^2$ has the same structure when more than one $R^2$ are contained in a molecule.

An amount of the compound containing the structure expressed by the general formula (1) is 2 to 15 wt % in the aromatic polyimide. By making it 2 wt % or more, it is possible to obtain the above-mentioned effect, and by making it 15 wt % or less, it is possible to maintain rigidity of the polyimide skeleton and to keep heat resistance and insulating property.

As compounds containing a structure expressed by the general formula (1), diamine components such as bis(3-aminopropyl)tetramethyl disiloxane, bis(p-aminophenyl) octamethyl pentasiloxane or the like are mentioned.

In the organic-solvent-soluble polyimide (a) used in the present invention which has at least one functional group capable of reacting with the epoxy group both in each of side chain and in the molecular end, it is preferable to have a structure expressed by the above-mentioned general formulas (2) to (7).

In the above-mentioned general formulas (2) to (7), $R^3$ denotes a structural component of an acidic dianhydride, and is a 4 to 14-valent organic group, and among them, it is preferable to be an organic group with 5 to 40 carbon atoms. And, $R^4$ denotes a structural component of a diamine, and is a 2 to 12-valent organic group, and among them, it is preferable to be an organic group with 5 to 40 carbon atoms. At least one of $R^3$ and $R^4$ has at least one group selected from the group consisting of 1,1,1,3,3,3-hexafluoropropyl group, isopropyl group, ether group, thioether group and $SO_2$ group, but it is preferable that the at least one group is contained in both of $R^3$ and $R^4$. $R^5$ and $R^6$ denote an organic groups having at least one of the group selected from the group consisting of phenolic hydroxyl group, sulfonic acid group and thiol group, and they may be same or different. X denotes a monovalent organic group, Y denotes a divalent organic group and Z denotes a monovalent organic group. m denotes the range of 8 to 200. Each of α and β denotes an integer of 0 to 10, α+β is an integer of 1 to 10.

$R^5$ is a substituent of the acidic dianhydride, and is selected from the group consisting of phenolic hydroxyl group, sulfonic acid group and thiol group. As the acidic dianhydride which has at least one of the above-mentioned substituent, concretely, aromatic acidic dianhydrides of the structure indicated below can be mentioned.

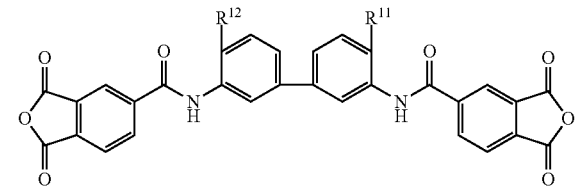

$R^{11}$ and $R^{12}$ denote hydrogen atom, hydroxyl group, thiol group or sulfonic acid group. However, $R^{11}$ and $R^{12}$ are not hydrogen atoms at the same time.

$R^3$ denotes a constituting component of an acidic dianhydride, and is selected from the group consisting of 1,1,1,3,3,3-hexafluoropropyl group, isopropyl group, ether group, thioether group and $SO_2$ group. As the acidic dianhydride which has at least one of the above-mentioned organic group, concretely, 2,2-bis(3,4-dicarboxyphenyl) propane dianhydride, 2,2-bis(2,3-dicarboxyphenyl) propane dianhydride, bis(3,4-dicarboxyphenyl) sulfone dianhydride, bis(3,4-dicarboxyphenyl)ether dianhydride, 2,2-bis(3,4-dicarboxyphenyl) hexafluoropropane dianhydride or compounds substituted in those aromatic ring with an alkyl group or a halogen atom, are mentioned.

As the acidic dianhydride which has at least one group selected from the group consisting of 1,1,1,3,3,3-hexafluoropropyl group, isopropyl group, ether group, thioether group and $SO_2$ group, and which has at least one group selected from the group consisting of phenolic hydroxyl group, sulfonic acid group and thiol group, concretely, aromatic acidic dianhydrides of the structure indicated below are mentioned.

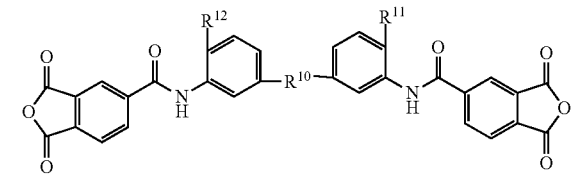

$R^{10}$ denotes $C(CF_3)_2$, $C(CH_3)_2$, $SO_2$, S or O. $R^{11}$ and $R^{12}$ denote hydrogen atom, hydroxyl group, thiol group or sulfonic acid group. However, $R^{11}$ and $R^{12}$ are not hydrogen atom at the same time.

As the acidic dianhydride when $R^3$ is an organic group other than 1,1,1,3,3,3-hexafluoropropyl group, isopropyl group, ether group, thioether group, and $SO_2$ group, and $R^5$ is an organic group other than phenolic hydroxyl group, sulfonic acid group and thiol group, concretely, aromatic tetracarboxylic dianhydrides such as pyromellitic dianhydride, 3,3',4,4'-biphenyl tetracarboxylic dianhydride, 2,3,3',4'-biphenyl tetracarboxylic dianhydride, 2,2',3,3'-biphenyl tetracarboxylic dianhydride, 3,3',4,4'-benzophenone tetracarboxylic dianhydride, 2,2',3,3'-benzophenone tetracarboxylic dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,2,5,6-naphthalene tetracarboxylic dianhydride, 2,3,6,7-naphthalene tetracarboxylic dianhydride, 2,3,5,6-pyridine tetracarboxylic dianhydride, 3,4,9,10-perilene tetracarboxylic dianhydride or compounds substituted in those aromatic ring with an alkyl group or halogen atom, are mentioned. The acidic dianhydride used in the present invention is used alone or in combination of two kinds or more.

$R^6$ is a substituent of diamine, and selected from the group consisting of phenolic hydroxyl group, sulfonic acid group and thiol group. As the diamine having at least one of the above-mentioned substituent, concretely, 3,3'-diamino-4,4'-dihydroxybiphenyl, 2,4-diaminophenol, 2,5-diaminophenol, 1,9-diamino-2,5-dihydroxybenzene, diaminodihydroxypyrimidine, diaminodihydroxypyridine, hydroxydiaminopyrimidine, 9,9-bis(3-amino4-hydroxyphenyl) fluorene, or compounds such as substituted in those aromatic ring with an alkyl group or halogen atom, or diamines such as of the structure indicated below, are mentioned.

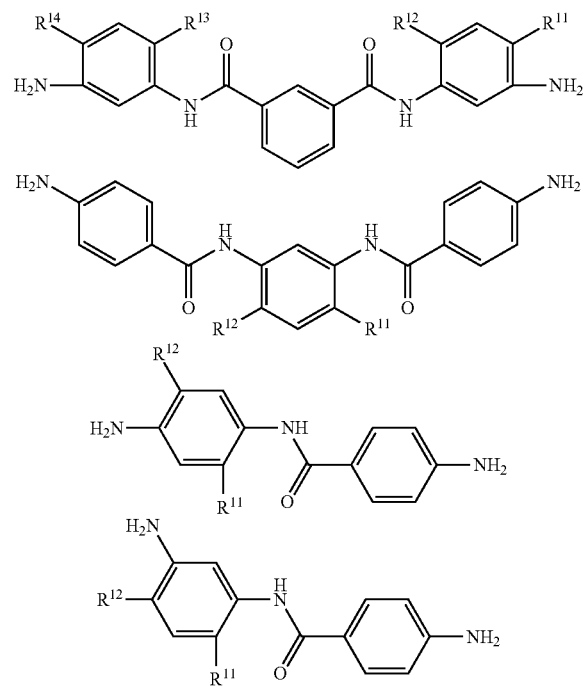

$R^{11}$ to $R^{14}$ denote hydrogen atom, hydroxyl group, thiol group or sulfonic acid group. However, $R^{11}$ and $R^{12}$ are not hydrogen atom at the same time.

$R^4$ denote constituting component of diamine, and selected from the group consisting of 1,1,1,3,3,3-hexafluoropropyl group, isopropyl group, ether group, thioether group and $SO_2$ group. As the diamine having at least one of the above-mentioned organic groups, concretely, 3,4'-diaminodiphenyl sulfide, 4,4'-diaminodiphenyl sulfide, 3,4'-diaminodiphenyl ether, 4,4'-diaminodiphenyl ether, 3,4'-diaminodiphenyl sulfone, 4,4'-diaminodiphenyl sulfone, bis(4-aminophenoxyphenyl) sulfone, bis(3-aminophenoxyphenyl) sulfone, bis(4-aminophenoxy)biphenyl, bis{4-(4-aminophenoxy)phenyl}ether, 1,4-bis(4-aminophenoxy)benzene, 1,3-bis(4-aminophenoxy)benzene, 2,2-bis[4-(4-aminophenoxy)phenyl] hexafluoropropane, 2,2-bis[4-(4-aminophenoxy)phenyl]propane, or compounds such as substituted in those aromatic ring with an alkyl group or halogen atom, are mentioned.

As the diamine which has at least one group selected from the group consisting of 1,1,1,3,3,3-hexafluoropropyl group, isopropyl group, ether group, thioether group and $SO_2$ group, and has at least one group selected from the group consisting of phenolic hydroxyl group, sulfonic acid group and thiol group, concretely; 2,2-bis(3-amino-4-hydroxyphenyl)hexafluoropropane, 2,2-bis(3-hydroxy-4-aminophenyl)hexafluoropropane, 2,2-bis(3-amino-4-hydroxyphenyl)propane, 2,2-bis(3-hydroxy-4-aminophenyl)propane, 3,3'-diamino-4,4''-dihydroxydiphenyl ether, 3,3'-diamino-4,4'-dihydroxydiphenyl sulfone, 3,3'-diamino-4,4'-dihydroxydiphenyl sulfide or compounds such as substituted in those aromatic ring with an alkyl group or halogen atom, or diamines of the structure indicated below, are mentioned.

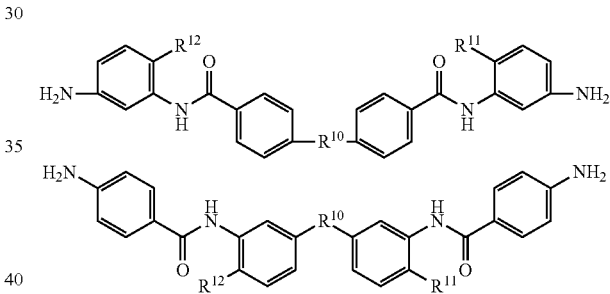

$R^{10}$ denotes $C(CF_3)_2$, $C(CH_3)_2$, $SO_2$, S or O. $R^{11}$ to $R^{12}$ denote hydrogen atom, hydroxyl group, thiol group or sulfonic acid group. However, $R^{11}$ and $R^{12}$ are not hydrogen atom at the same time.

As the diamines in case where $R^4$ is an organic group other than 1,1,1,3,3,3-hexafluoropropyl group, isopropyl group, ether group, thioether group, and $SO_2$ group, and $R^6$ is an organic group other than phenolic hydroxyl group, sulfonic acid group and thiol group, concretely, 3,4'-diaminodiphenyl methane, 4,4'-diaminodiphenyl methane, benzidine, m-phenylene diamine, p-phenylene diamine, 1,5-naphthalene diamine, 2,6-naphthalene diamine, 2,2'-dimethyl-4,4'-diaminobiphenyl, 2,2'-diethyl 4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, or compounds such as substituted in those aromatic ring with an alkyl group or halogen atom, terephthalic hydrazide, isophthalic hydrazide, phthalic hydrazide, 2,6-naphthalene dicarboxylic dihydrazide, 4,4'-bisphenyl dicarbonohydrazine, 4,4'-cyclohexane dicarbonohydrazine, or compounds such as substituted in those aromatic ring with an alkyl group or halogen atom. The diamine used in the present invention can be used alone or in combination of two kinds or more.

Cross-linking density of the adhesive composition for semiconductor can be controlled by controlling degree of reaction between the aromatic polyimide and the epoxy compound at the time of heat treatment by selecting $R^5$ and $R^6$ in the above-mentioned general formulas (2) to (7). By this way, it becomes possible to giving heat resistance and chemical resistance, which are necessary to the adhesive composition for semiconductor. It is preferable that 20 to 90% of the total of $R^5$ and $R^6$ is hydroxyl group, thiol group or sulfonic acid group. As for these groups, by making $R^5$ and $R^6$ 20% or more, it becomes possible to improve chemical resistance and heat resistance, and by making 90% or less, it becomes possible to suppress the cross-linking density in a proper range to maintain an elongation and toughness of film.

It is preferable that X, which is a structural component the general formula (2) and the general formula (3), has at least one functional group capable of reacting with epoxy group. As such functional groups, for example, phenolic hydroxyl group, sulfonic acid group, thiol group or the like are mentioned. It is preferable that X has a structure indicated in the following the general formula (8), and these are components originated from primary monoamine which is an end capping agent. And, X which constitutes the general formula (2) and the general, formula (3) may be either of an end capping group expressed by the general formula (8) alone, or a combination with other end capping group.

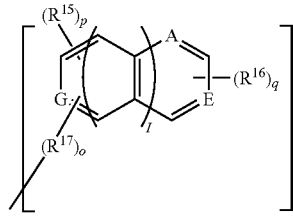

(8)

Further, it is preferable that Y, which is a structural component of the general formula (4) and the general formula (5), has at least one functional group capable of reacting with epoxy group. It is preferable that Y has a structure indicated in the general formula (9) or the general formula (10), and it is a component originated from an acid anhydride among the carboxylic acid derivatives which are end capping agents. And, Y which constitutes the general formula (4) and the general formula (5) may be either of an end capping group alone expressed by the general formula (9) or the general formula (10), or a combination of the two with other end capping group.

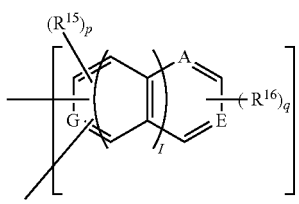

(9)

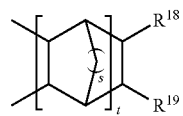

(10)

It is preferable that Z, which is a structural component of the general formula (6) and the general formula (7), has at least one functional group capable of reacting with epoxy group. It is preferable that Z has a structure indicated in the general formula (11) or the general formula (12), and it is a component originated from a monocarboxylic acid, monoacid chloride compound or monoactive ester compound among the carboxylic acid derivatives which are end capping agents. Further, Z which constitutes the general formula (6) and the general formula (7) may be either of an end capping group expressed by any one of the general formula (11) and the general formula (12) alone, or a combination with other end capping group.

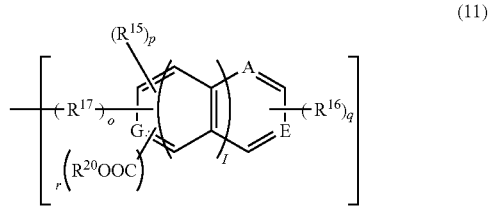

(11)

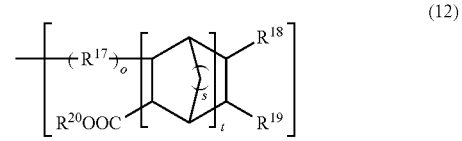

(12)

$R^{17}$ of the general formula (8), the general formula (11) and the general formula (12) denotes a divalent group selected from $-CR^{21}R^{22}-$, $-CH_2O-$ and $-CH_2SO_2-$, $R^{21}$ and $R^{22}$ denote a monovalent group selected from hydrogen atom, hydroxyl group and hydrocarbon group with 1 to 10 carbons. $R^{20}$ of the general formula (11) and of the general formula (12) denotes a monovalent group selected from hydrocarbon group with 1 to 10 carbons. Among them, a hydrocarbon group with 1 to 4 carbons is preferable, and especially preferably, it is methyl group or t-butyl group. $R^{18}$ and $R^{19}$ of the general formula (10) and the general formula (12) denote monovalent groups selected from hydrogen atom, hydroxyl group, carboxyl group, sulfonic acid group, thiol group and hydrocarbon group with 1 to 4-carbons, but at least one is hydroxyl group, carboxyl group, sulfonic acid group or thiol group. Further, $R^{15}$ and $R^{16}$ of the general formula (8), the general formula (9) and the general formula (11) denote monovalent groups selected from hydrogen atom, hydroxyl group, carboxyl group, sulfonic acid group, thiol group and hydrocarbon group with 1 to 10 carbons, but at least one is hydroxyl group, carboxyl group, sulfonic acid group or thiol group. A, E, G of the general formula (8), the general formula (9) and the general formula (11), are carbon atom or nitrogen atom, and each of them may be same or different. o is an integer of 0 to 10, and preferably, it is an integer of 0 to 4. l is 0 or 1, and preferably, it is 0. p is 0 or 1, and preferably, it is 0. q is an integer of 1 to 3, and preferably, it is 1 or 2. r, s, t are 0 or 1.

As primary monoamine having a structure expressed by the general formula (8), concretely, 5-amino-8-hydroquinoline, 4-amino-8-hydroquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalycylic acid, 5-aminosalycylic acid, 6-aminosalycylic acid, 3-amino-o-toluic acid, ameride, 2-aminobenzoic acid, 3-aminobenzoic acid, 4-aminobenzoic acid, 2-aminobenzene sulfonic acid, 3-aminobenzene sulfonic acid, 4-aminobenzene sulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyridine, 2-aminothiophenol, 3-aminothiophenol, 4-aminothiophenol or the like are mentioned.

Among them, 5-amino-8-hydroquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalycylic acid, 5-aminosalycylic acid, 6-aminosalycylic acid, 2-aminobenzene sulfonic acid, 3-aminobenzene sulfonic acid, 4-aminobenzene sulfonic acid, 3-amino-4,6-dihydroxypyrimidine, 2-aminophenol, 3-aminophenol, 4-aminophenol, 2-aminothiophenol, 3-aminothiophenol, 4-aminothiophenol or the like are preferable.

In particular, 5-amino-8-hydroquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 3-amino-4,6-dihydroxypyrimidine, 2-aminophenol, 3-aminophenol, 4-aminophenol, 2-aminothiophenol, 3-aminothiophenol, 4-aminothiophenol or the like are preferable, and they are used alone or in combination of two kinds or more.

As concrete examples of acid anhydrides having the structures expressed by the general formula (9) or the general formula (10), there are phthalic anhydride, maleic anhydride, nadic acid, cyclohexane dicarboxylic anhydride or the like, and more preferably, acid anhydrides such as 3-hydroxyphthalic anhydride, 4-hydroxyphthalic anhydride and trimellitic anhydride are mentioned.

As concrete examples of carboxylic acid derivative, monocarboxylic acid, monoacid chloride compound or monoactive ester compound which has a structure expressed by the general formula (11) or the general formula (12), monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzene sulfonic acid, 3-carboxybenzene sulfonic acid, 4-carboxybenzene sulfonic acid, and monoacid chloride compounds in which these carboxyl groups are acid chlorinated, and monoacid chloride compound in which only monocarboxylic group of dicarboxylic acids such as terephthalic acid, phthalic acid, maleic acid, cyclohexane dicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, 2,7-dicarboxynaphthalene is acid chlorinated, and active ester compounds obtained by reaction between a monoacid chloride compound and N-hydroxy-5-norbornene-2,3-dicarboxylmide, p-nitrophenol, N-hydroxysuccinic imide, N-hydroxyphthalic imide, N-hydroxybenzotriazole or the like, are mentioned.

Among these compounds, in view of easiness of introducing them into polymer, acid anhydride such as phthalic anhydride, maleic anhydride, nadic acid, cyclohexane dicarboxylic anhydride, 3-hydroxyphthalic anhydride, or monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzene sulfonic acid, 4-carboxybenzene sulfonic acid, are preferably used. These are used alone, or in combination of two kinds or more.

The ratio to be introduced of the component expressed by the general formula (8) (X component of the general formula (3)) is, when converted into primary monoamine component of the end capping agent which is the starting component, preferably in the range of 0.1 to 60 mol % with respect to the total diamine component, and especially preferably, it is 5 to 50 mol %. The ratio to be introduced of the component expressed by the general formula (9) or the general formula (10) (Y component of the general formula (2) and the general formula (5)) or of the component expressed by the general formula (11) or the general formula (12) (Z component of the general formula (4), the general formula (6) and the general formula (7)) is, when converted into the acid anhydride, monocarboxylic acid, monoacid chloride compound and monoactive ester compound component of the end capping agent which are the starting materials, preferably in the range of 0.1 to 60 mol % with respect to the total diamine component, and especially preferably, it is 5 to 55 mol %.

m of the general formulas (2) to (7) indicates repeating number of polymer, and is in the range of 8 to 200. It preferably is 10 to 150. When expressed by a weight average molecular weight, it preferably is 4000 to 80000 in the polystyrene conversion of gel filtration chromatography, especially preferably, it is 8000 to 60000. By making m 8 or more, viscosity of the composition can be increased to make a thick coating possible, and by making m 200 or less, solubility to solvent can be increased.

The organic-solvent-soluble polyimide (a) of the present invention may consist of the structure expressed by the general formulas (2) to (7), or may consist of a copolymer or mixture having other structure, too. At that time, it is preferable to contain the structure expressed by the general formulas (2) to (7) in an amount of 50 mol % or more. As for kind and amount of the structure used for the copolymerization or mixing, it is preferable to select them in a range which does not impair heat resistance of the heat resistant resin film obtained by heat treatment.

The organic-solvent-soluble polyimide (a) used in the present invention is synthesized by applying a known method by replacing a part of diamine to an end capping agent which is a monoamine, or, by replacing a portion of acidic dianhydride to an end capping agent which is a monocarboxylic acid, an acid anhydride, a monoacid chloride compound or a monoactive ester compound. For example, a polyimide precursor is obtained by applying a method of reacting a tetracarboxylic dianhydride with a diamine compound (a portion is substituted with an end capping agent which is a monoamine) at a low temperature, a method of reacting a tetracarboxylic dianhydride (a portion is substituted with an end capping agent which is an acid anhydride, monoacid chloride compound or a monoactive ester compound) with a diamine compound at a low temperature, a method of obtaining a diester by a reaction between a tetracarboxylic dianhydride and an alcohol, and then reacting it with a diamine (a portion is substituted with an end capping agent which is a monoamine) in presence of a condensing agent, a method of obtaining a diester by a reaction between a tetracarboxylic dianhydride and an alcohol, and then the residual dicarboxylic acid is acid chlorinated and reacted with a diamine (a portion is substituted with an end capping agent which is a monoamine), or the like, and successively an organic-solvent-soluble polyimide can be synthesized by subjecting it to a known imidization method.

Further, a structure of the general formula (1) introduced to the polymer and an end capping agent used in the present invention can easily be detected and quantatively analyzed by the following method. For example, a polymer in which a structure of the general formula (1) and an end capping agent are introduced is dissolved in an acidic or a basic solution to decompose it into diamine component and acid anhydride component which are structural units of the polymer, and by subjecting this to a gas chromatography or a nuclear magnetic resonance measurement, it is possible to easily detect and quantitatively analyze the structure of the general formula (1) and the end capping agent used. Other than that, by subjecting a polyimide, to which an end capping agent is introduced, directly to a pyrolysis gas chromatography or an infra-red spectrum and $^{13}C$ nuclear magnetic resonance spectrum measurement, it is also possible to easily detect and quantitatively analyze the structure of the general formula (1) and the end capping agent used.

The amount contained of the organic-solvent-soluble polyimide (a) is 15 to 90 wt parts with respect to the epoxy compound (b) 100 wt parts, and it preferably is 30 to 65 wt parts. When the amount contained of the organic-solvent-soluble polyimide (a) is less than 15 wt parts, at the time of dicing, the adhesive composition for semiconductor may peel off from semiconductor wafer, or a crack or defect may be caused. Such a defect at the time of dicing becomes more notable as the dicing speed becomes higher. And, in case where the amount contained of the organic-solvent-soluble polyimide (a) exceeds 90 wt parts, at the time of laminating the adhesive composition for semiconductor which is made into a sheet (adhesive sheet) to semiconductor wafer provided with bump electrodes, the adhesive composition for semiconductor does not sufficiently penetrate between bump electrodes and bubbles remain, and the adhesive strength between the semiconductor chip and the circuit substrate after flip chip assembly decreases. Further, other than the above-mentioned, because the adhesive composition for semiconductor becomes more water absorptive, when the semiconductor chip with the adhesive composition layer for semiconductor after dicing is flip chip mounted to a circuit substrate, moisture component in the adhesive composition for semiconductor evaporates rapidly by heat at the time of the flip chip assembly, and the adhesive composition layer for semiconductor foams. This decrease of the adhesive strength and the foaming cause a decrease of connection reliability between the semiconductor chip and the circuit substrate.

The adhesive composition for semiconductor of the present invention, furthermore, contains the epoxy compound (b). Since the epoxy compound (b) reacts with the phenolic hydroxyl group, sulfonic acid group and thiol group of the polyimide side chain and molecular end to constitute a high density network structure, the obtained adhesive composition for semiconductor exhibits resistance to various chemicals. It is possible to make completely insoluble to various solvents, especially to N-methylpyrrolidone. And, since epoxy compound is generally hardened by ring-opening reaction which is not accompanied by a shrinkage, it becomes possible that, in the adhesive composition for semiconductor of the present invention containing the epoxy compound (b), shrinkage at the time of hardening is decreased. For that reason, as the epoxy compound (b), it is preferable to use those with 2 or more epoxy groups, and it is preferable that the epoxy equivalent is 100 to 500. Since it is possible to improve toughness of heat resistant resin film by making the epoxy equivalent 100 or more and since it is possible to make a high density network-structure after heat hardening by making it 500 or less, it is possible to make the adhesive composition for semiconductor of a good insulation.

Further, the epoxy compound (b) contains two kinds of a liquid state and of a solid state, and it is necessary that a containing ratio of the liquid epoxy compound is 20 wt % or more and 60 wt % or less with respect to the total amount of the epoxy compound. It preferably is 30 wt % or more and 50 wt % or less. By using the liquid epoxy compound in this range, it is possible to give a moderate plasticity and flexibility to the adhesive composition for semiconductor, and when the adhesive composition for semiconductor is made into a sheet, a flexible sheet (adhesive sheet) can be obtained. Furthermore, a crack or defect of the adhesive composition for semiconductor at the time of dicing can be prevented. If the liquid epoxy compound is less than 20 wt %, a problem of crack or peeling off from plastic film when the adhesive composition for semiconductor is formed on a plastic film and bent into a roll state, a problem of causing a crack or defect to the adhesive sheet at the time of dicing, a problem of peeling off of the adhesive composition for semiconductor from semiconductor wafer, or the like arises. When the amount contained of the liquid epoxy compound exceeds 60 wt % with respect to the total amount of the epoxy compound, dicing dust at the time of dicing becomes apt to stick, and adhesiveness between the semiconductor chip and the circuit substrate after flip chip assembly carried out later or electric conduction reliability decreases. Here, the liquid epoxy compound has a viscosity of 150 Pa·s or less at 25° C. and $1.013 \times 10^5$ N/m², and those which exhibit a viscosity exceeding 150 Pa·s at 25° C. are the solid epoxy compound. As far as such epoxy compounds, they are not especially limited, and as the liquid epoxy compound, for example, Epikote 828, Epikote 1002, Epikote 1750, Epikote 152, Epikote 630, (the aboves are tradenames, produced by Japan Epoxy Resins Co., Ltd.), Epiclon HP4032 (the above is a tradename, produced by Dainippon Ink and Chemicals, Inc.), or the like, are mentioned. Two kinds or more of them can be combined. And, as the solid epoxy compound, Epikote 1002, Epikote 1001, YX4000H, Epikote 4004P, Epikote 5050, Epikote 154, Epikote 157S70, Epikote 180S70, YX4000H (the aboves are tradenames, produced by Japan Epoxy Resins Co., Ltd.), Tepic S, Tepic G, Tepic P (the aboves are tradenames, produced by Nissan Chemical Industries, Ltd.), Epotote YH-434L (tradename, produced by Tohto Kasei Co., Ltd.), EPPN502H, NC3000 (the aboves are tradenames, produced by Nippon Kayaku Co., Ltd.), Epiclon N695, Epiclon HP-7200 (the aboves are tradenames, produced by Dainippon Ink and Chemicals, Inc.), or the like, are mentioned. Among these, two kinds or more may also be used in combination.

To the adhesive composition for semiconductor of the present invention, furthermore, the hardening accelerator (c) is used. By using the epoxy compound and the hardening accelerator in combination, hardening of the solid epoxy compound and the liquid epoxy compound is accelerated, and it is possible to harden in a short time. As the hardening accelerator, various imidazoles, imidazole silanes, imidazolines, acid anhydrides or the like are mentioned. As the various imidazoles, imidazole, 2-methyl imidazole, 2-undecyl imidazole, 2-ethyl-4-methyl imidazole, 2-phenyl-4-methyl imidazole, 2-phenyl imidazole, 1-benzyl-2-methyl imidazole, 1-benzyl-2-phenyl imidazole, 1-cyanoethyl-2-methyl imidazole, 1-cyanoethyl-2-ethyl-4-methyl imidazole, 1-cyanoethyl-2-phenyl imidazole, 1-cyanoethyl-2-phenyl imidazolium trimellitate or the like are mentioned. As the imidazole silanes, IS-1000, IS-1000D, IM-1000, SP-1000, IA-100A, IA-100P, IA-100F (the aboves are tradenames, produced by Nikko Materialc Co., Ltd.) or the like are mentioned. As the acid anhydrides, hexahydrophthalic anhydride, methyl tetrahydrophthalic anhydride, Adeka Hardener EH-3326, Adeka Hardener EH-703, Adeka Hardener EH-705A (the aboves are tradenames, produced by Adeka Corporation), Epiclon B-570, Epiclon B-650 (the aboves are tradenames, produced by Dainippon Ink and Chemicals, Inc.) or the like are mentioned. It is necessary that the amount contained of the hardening accelerator (c) is, with respect to 100 wt parts of the total epoxy compound (b), in the range of 0.1 to 10 wt parts. By making the amount contained of the hardening accelerator (c) 0.1 wt parts or more, it is possible to effectively accelerate the hardening of the epoxy compound, and by making 10 wt parts or less, it is possible to improve insulation and heat resistance of the hardened product. And, as the hardening accelerator (c), those insoluble to water are preferably used. Here, "insoluble to water" means that a solubility to pure water at 25° C. under $1.013 \times 10^5$ N/m² is 5 wt % or less. A water soluble hardening accelerator dissolves in water used in dicing process used at the time of dicing, and may roughen the film surface of the adhesive composition for semiconductor sheet or may cause a decrease of hardening property or adhesiveness.

To the adhesive composition for semiconductor of the present invention, as a thermoplastic resin, for example, a phenoxy resin, a polyester, a polyurethane, a polyamide, a polypropylene, an acrylonitrile-butadiene copolymer (NBR), a styrene-butadiene copolymer (SBR), an acrylonitrile-butadiene-methacrylic acid copolymer, an acrylonitrile-butadiene-acrylic acid copolymer or the like can be added as a plasticizer for the film after hardening. And, it is possible to add a filler to an extent that a light transmittance is not damaged and the known hardener of epoxy compound.

The adhesive composition for semiconductor of the present invention may be coated on a semiconductor wafer provided with bump electrodes. In order to make the adhesive composition for semiconductor of the present invention sheet-like, it can be prepared by holding a uniformly mixed adhesive composition for semiconductor between plastic films or the like and subjected to a press sheeting, or roll milling. Furthermore, it is also possible to make the adhesive composition for semiconductor, which is made into varnish state by being mixed in a solvent, sheet-like by coating it on a plastic film and by desolventing. In the present invention, the plastic film and the adhesive composition for semiconductor formed on the plastic film are referred to as the adhesive sheet material for semiconductor.

As solvents used here, those which dissolve the above-mentioned component may be selected appropriately, for example, as ketone-based solvent, acetone, methyl ethyl ketone, methyl isobutyl ketone cyclopentanone, cyclohexanone, as ether-based solvent, 1,4-dioxane, tetrahydrofuran, diglyme, as glycol ether-based solvent, methyl cellosolve, ethyl cellosolve, propylene glycol monomethyl ether, propylene glycol monoethyl ether, propylene glycol monobutyl ether, diethylene glycol methyl ethyl ether, and other than that, benzyl alcohol, propanol, N-methyl pyrrolidone, γ-butyrolactone, ethyl acetate, N,N-dimethyl formamide, or the like are mentioned. In particular, when a solvent of which boiling point at atmospheric pressure is 120° C. or less is used, since desolvent is possible at a low temperature in a short time, it becomes easy to make the sheet.

As coating machine, a roll coater, a comma roll coater, a gravure coater, a screen coater, a slit die coater or the like can be used, but a slit die coater is preferably used since solvent evaporation at the time of coating is little and coatability becomes stable.

The thickness of the adhesive composition for semiconductor which is made into sheet is, in case where the adhesive composition for semiconductor which is made into sheet is laminated to a semiconductor wafer provided with bump electrodes, preferably the same as the average height of the bump electrodes or thicker, more preferably, it is the same as the average height of the bump electrodes or thicker and the same as 1.5 times of the total height of the average height of the bump electrodes and the average height of the pad electrodes on circuit substrate or thinner, and still more preferably, it is the same as the average height of the bump electrodes or thicker and the total height of the average height of the bump electrodes and the average height of the pad electrodes on circuit substrate or thinner. Here, the height of the bump electrode is measured provided that the wafer surface on which no bump electrode is fabricated is the standard (0 µm). Further, as the height of the pad electrode on circuit substrate, provided that the insulated surface of circuit substrate (polyimide, glass epoxy, glass, ceramics or the like) on which pad electrodes are fabricated is the standard (0 µm), all heights of the electrode pads are measured and their average is taken. If the thickness of the adhesive composition for semiconductor which was made into sheet is less than the average height of the bump electrodes, voids are generated between the semiconductor chip or the adhesive composition for semiconductor and the circuit substrate after flip chip bonding, and the adhesive strength decreases. And, if the thickness of the adhesive composition for semiconductor which was made into sheet exceeds 1.5 times of total height of the average height of bump electrodes and the average height of pad electrodes on the circuit substrate, it is not only uneconomical but also may cause problems such as that an area for mounting becomes large due to increasing amount of flowing out of the adhesive composition for semiconductor under the semiconductor chip, or that the adhesive composition for semiconductor which flowed out diffuses to upper portion of the semiconductor chip and contaminates a heating horn of a flip chip bonding device to cause a bonding of the horn and the semiconductor chip. Further, when the heating horn is contaminated, there may cause a problem that the flatness of the horn is impaired and heating condition of the semiconductor chip at the time of flip chip bonding becomes not uniform, and a bonding defect becomes likely to occur.

It is preferable that a light transmittance of the adhesive composition for semiconductor of the present invention is 70% or more. In order to make the light transmittance of the adhesive composition for semiconductor 70% or more, it is effective to adopt methods such as that a compatibility between all component is improved by using each constituting component of the adhesive composition for semiconductor of a similar structure, or that an amount contained of particles or micro capsules which may be a damaging factor to light transmittance is decreased to an extent which does not affect the light transmittance seriously. Here, other properties may be controlled by adding the particles or micro capsules in a range which does not seriously impair the light transmittance. As the particles, inorganic particles such as of a metal or an oxide having electrical conductivity, electrically non-conductive particles such as of an oxide or a nitride, organic particles, particles in which an organic substance is coated with an inorganic substance, or the like can be used. In order to decrease the impairing effect to the light transmittance while including particles in the adhesive composition for semiconductor, it is effective to use, as the particles, those having a small diameter or to use those of which refractive index difference with other materials constituting the adhesive composition for semiconductor is small. If the light transmittance of the adhesive composition for semiconductor is 70% or more, detection of alignment marks on the bump electrodes or semiconductor wafer at the time of dicing is easy, and it is possible to cut highly precisely. Furthermore, if the light transmittance of the adhesive composition for semiconductor is 70% or more, the detection of alignment marks at the time of flip chip assembly similarly becomes better, too, and it is possible to highly precisely bond electrode pads on circuit substrate and the semiconductor chip. It is preferable that the light transmittance of the adhesive composition for semiconductor is 80% or more, since the detection of alignment marks is possible in a short time. Here, the light transmittance in the present invention is the maximum light transmittance of the adhesive composition for semiconductor in the wavelength of 350 to 900 nm to the adhesive composition for semiconductor. Concretely, a light transmittance at wavelength of 350 nm to 900 nm is measured, and the average value of light transmittance in the wavelength of ±10 nm of which center is the wavelength at which the maximum light transmittance is shown is taken as the light transmittance value of the present invention. The light transmittance of the adhesive composition for semiconductor may depend on the thickness of the adhesive composition for semiconductor which was made into sheet. On the other hand, the thickness of the adhesive composition for semiconductor which is used by being made into sheet differs according to the height of bump built on the semiconductor or the like. The light transmittance of the adhesive composition for semiconductor of the present invention is, since it is for the reading of alignment marks at the time of dicing or/and flip chip assembly, the light transmittance of the adhesive composition for semiconductor of the thickness used for dicing or flip chip assembly.

In case where the light transmittance of the adhesive composition for semiconductor formed on a plastic film which transmits light is measured, a measurement for the plastic film alone which transmit light is carried out separately and a calibration is carried out for taking the value in which the influence of the plastic film is deducted as the light transmittance. The measurement of the light transmittance is carried out under a circumstance of a temperature 23±2° C. and a relative humidity 50±5%. Such a measurement can be carried out, for example, by using a spectrophotometer (produced by Hitachi, Ltd., U-3210).

In the adhesive sheet material for semiconductor prepared by the above-mentioned method, it is preferable that an adhesive strength between the plastic film and the adhesive composition for semiconductor is 2 N/m or more and 49 N/m or less. By making it 2 N/m or more, it is possible to obtain an adhesive sheet material for semiconductor in which an unwilling peeling off between the plastic film and the adhesive composition for semiconductor does not occur and which is excellent in handling. By making the adhesive strength between the plastic film and the adhesive composition for semiconductor 49 N/m or less, the adhesive composition for semiconductor becomes hardly to remain on surface of the plastic film, when the plastic film is peeled off.

Further, if necessary, it is possible to obtain an adhesive sheet material for semiconductor sandwiched with plastic films on both sides by further laminating on the adhesive composition for semiconductor with another plastic film. At this time, the adhesive strength of each side is not especially limited, but each side preferably has an adhesive strength of 2 N/m or more and 49 N/m or less. Further, provided that one plastic film is plastic film (d), and another plastic film is plastic film (e), it is preferable that the difference of adhesive strengths between the plastic film (e) and the adhesive composition for semiconductor and the adhesive strength between the plastic film (d) and the adhesive composition for semiconductor is 5 N/m or more. At this time, the adhesive strength between the plastic film (e) and the adhesive composition for semiconductor is larger than the adhesive strength between the plastic film (d) and the adhesive composition for semiconductor. Further, it is preferable that the difference of the above-mentioned adhesive strengths is 47 N/m or less. By controlling the difference of the adhesive strengths to 5 N/m or more, it is possible to prevent an occurrence of delamination or foliation of the adhesive composition for semiconductor when the plastic film is peeled off, and by controlling the difference of adhesive strengths to 47 N/m or less, the adhesive composition for semiconductor becomes hardly to remain on surface of the plastic film when the film is peeled off.

The adhesive strength between the plastic film (d) and the adhesive composition for semiconductor can be measured by the following way. First, the adhesive sheet material for semiconductor is cut into 25 mm width and 300 mm length, and this is fixed to a stainless steel plate of 2 mm thickness with a double-sided pressure sensitive adhesive tape. At this time, a surface of the plastic film (d) is adhered to a sticky material surface of the double-sided sticky material tape. Next, an adhesive strength (N/m) between the plastic film (d) and adhesive layer of the semiconductor is measured by peeling off the plastic film (d) from the adhesive composition for semiconductor in a direction of 90° and at a speed of 200 mm/min.

The adhesive strength between the plastic film (e) and the adhesive composition for semiconductor can be measured in the following way. First, the adhesive sheet material for semiconductor is cut into 25 mm width and 300 mm length, and after removing the plastic film (d), it is fixed with a double-sided sticky material tape on a stainless steel plate of 2 mm thickness to which the double-sided sticky material tape is affixed. At this time, the side of the adhesive composition for semiconductor is adhered to a sticky material surface of the double-sided sticky material tape. The adhesive strength (N/m) between the plastic film (e) and the adhesive composition for semiconductor is measured by peeling off the plastic film (e) from the adhesive composition for semiconductor in a direction of 90° and at a speed of 200 mm/min.

As plastic films which can be used here, polyethylene terephthalate film, polyethylene naphthalate film, polyester film, polyvinyl chloride film, polycarbonate film, polyimide film or the like are mentioned. And, fluororesin films such as polytetrafluoroethylene film, polyphenylene sulfide film, polypropylene film, polyethylene film or the like are mentioned. The plastic film may be treated with a releasing agent, for example, it may be treated with a silicone-based, long-chain alkyl-based, fluoro-based, aliphatic amide-based releasing agent or the like. The adhesive strength between the plastic film and the adhesive composition for semiconductor can be controlled by selection of kind or thickness of the plastic film, composition of the adhesive composition for semiconductor such as an amount of the liquid epoxy resin or an addition of a tacky component which is liquid state at room temperature, kind of solvent, heat aging of the adhesive sheet material for semiconductor, or the like.

Further, a sticky material layer may be formed on surface of the plastic film (e). In case where a sticky material layer of surface of the plastic film (e) is formed, the plastic film (e) and the adhesive composition for semiconductor are laminated such that the surface of this sticky material layer is adhered to the adhesive composition for semiconductor. In this case, it is important that the sticky material adhesive strength between the plastic film (e) and the sticky material layer is made larger than the adhesive strength between the sticky material layer and the adhesive composition for semiconductor so that the sticky material does not remain on the adhesive composition for semiconductor when the plastic film (e) is peeled off from the adhesive composition for semiconductor. As sticky materials, an acryl-based, a vinyl-based, a urethane-based, a silicone based, a polyester-based, a styrene-butadiene-based, an isoprene-based, a natural rubber or the like can be used. Sticky material of which adhesion-peeling off system is a pressure sensitive type, a heat hardening peeling off type and a photo hardening peeling off type can be used. As for thickness of the sticky material layer, the best thickness is determined by kind of the sticky material and using method, and usually a layer of 1 to 50 μm can be used. As such a plastic film provided with a sticky material layer, it is also possible to use a sticky material tape which is commercialized as a backgrind tape, dicing tape or the like. Other than that, without using the plastic film (e) to which a sticky material layer is formed beforehand, after forming by a coating of a sticky material layer on the layer of the adhesive composition layer for semiconductor, a plastic film (e) may be formed to the adhesive composition layer for semiconductor which has been laminated with a sticky material layer by a method such as a lamination.

As for the semiconductor device of the present invention, in case where it has plastic films on both sides of the above-mentioned adhesive composition for semiconductor, after removing plastic film (d), the exposed surface of the adhesive composition for semiconductor is temporarily bonded to a semiconductor wafer provided with bump electrodes by heat lamination at 40 to 100° C. or by a vacuum heat lamination. In this temperature range, it is preferable that the dynamic viscosity of the adhesive composition for semiconductor is 10 to 100,000 Pa·s, and more preferably, it is 1,000 to 10,000 Pa·s. When the dynamic viscosity of the adhesive composition for semiconductor is less than 10 Pa·s, its handling becomes difficult, and when it exceeds 100,000 Pa·s, problems may arise such as that the bump electrodes cannot be mounted in the adhesive composition for semiconductor and that a lamination at high pressure becomes necessary, or the wafer is broken. Further, it is not preferable to laminate at high pressure since a curl may occur after the lamination.

Next, as necessary, a backgrind processing may be carried out in the following way. That is, the surface of plastic film (e) of the semiconductor wafer provided with the plastic film (e) and the adhesive composition for semiconductor obtained by the above-mentioned process is placed on a fixing plate of a backgrind processing equipment, and a grinding-polishing processing of the wafer surface on which a semiconductor is not fabricated (back surface) may be carried out. By subjecting such a processing, a thin type semiconductor wafer provided with the adhesive composition for semiconductor can be obtained. By this processing step, process can be simplified compared to a usual method in which a backgrind step and an adhesive coating for semiconductor chip mounting are carried out separately.

Next, the plastic film (e) obtained by the above-mentioned step, the semiconductor wafer provided with the adhesive composition for semiconductor and a tape frame is affixed to a dicing tape. At this time, as for the plastic film (e) and the semiconductor wafer provided with the adhesive composition for semiconductor, the surface opposite to the bump electrodes is adhered to the adhesive surface of the dicing tape. After that, dicing is carried out.

In the dicing step, first, on a cut table, the tape frame to which the semiconductor wafer provided with the bump electrodes, which is provided with the plastic film (e) and the adhesive composition for semiconductor, prepared by the above-mentioned method is affixed with the dicing tape, is set, and next, the plastic film (e) is peeled off. On the device, the alignment marks on the bump electrodes or semiconductor wafer are detected, and the dicing is carried out by controlling respective dicing conditions such as a cutting size, dicing speed, thickness, blade rotational speed and amount of water spraying to blad to predetermined values. Here, it is preferable that the alignment marks on semiconductor wafer contains a polygonal structure, and by using alignment marks of such structure, it is possible to decrease alignment errors. It is preferable that drying of the wafer after dicing is carried out at 25 to 100° C. and for 10 seconds to 4 hours. It is preferable that the crack, defect and delamination from the semiconductor wafer of the adhesive composition for semiconductor caused by the dicing is 25 μm of less in its maximum length, provided that the diced edge is taken as the standard position, i.e., 0 μm. When the crack, defect, or delamination from semiconductor wafer of the adhesive composition for semiconductor exceeds 25 μm, the adhesive composition for semiconductor at the time of dicing and after dicing becomes apt to adsorb or to be deposited with water. The adsorbed water causes spaces or voids in the adhesive composition layer at the time of the flip chip assembly which is carried out later, and it brings about decreases of the adhesive strength and electric reliability. These crack, defect and delamination from the semiconductor wafer are apt to occur at cross-cut portions of the adhesive composition for semiconductor (portions corresponding to corners of the semiconductor chip).

Next, the semiconductor chip provided with the adhesive composition for semiconductor obtained by the dicing is mounted to a circuit substrate by an ordinary flip chip bonder. The mounting condition is not especially limited as far as it is in the range capable of obtaining an electric connection well between the semiconductor chip and the circuit substrate, and it is appropriately determined depending on a material for electrodes of the bumps or circuit substrate. Further, when the hardening of the adhesive composition for semiconductor is insufficient, the hardening may further be carried out by heating the circuit substrate for mounting the semiconductor chips, after the mounting.

EXAMPLES

Hereunder, the present invention is explained with reference to examples but, the present is not limited to these examples. Here, the evaluation of the adhesive composition for semiconductor was carried out according to the following methods.

Synthesis Example 1

Synthesis of Organic-Solvent-Soluble Polyimide A 2,2-bis(3-amino-4-hydroxyphenyl) hexafluoropropane (hereunder, referred to as BAHF) 24.54 g (0.067 mol), 1,3-bis(3-aminopropyl)tetramethyl disiloxane (hereunder, referred to as SiDA) 4.97 g (0.02 mol) and as an end capping agent, 3-aminophenol (hereunder, referred to as 3-Aph) 2.18 g (0.02 mol) were dissolved in NMP 80 g under a dried nitrogen flow. To this, bis(3,4-dicarboxyphenyl)ether dianhydride (hereunder, referred to as ODPA) 31.02 g (0.1 mol) was added together with NMP 20 g, reacted at 20° C. for one hour, and then stirred at 50° C. for 4 hours. After that, xylene 15 g was added and stirred at 180° C. for 5 hours while water was distilled off azeotoropically together with the xylene. After finishing the stirring, the solution was poured into water 3 liters to obtain a precipitated white polymer. This precipitate was collected by filtration and after washed with water 3 times, it was dried at 80° C. for 20 hours by a vacuum drier. When an infra-red absorption spectrum of the obtained solid polymer was obtained, absorption peaks of an imide structure originated from a polyimide were detected around 1780 cm$^{-1}$, and 1377 cm$^{-1}$. In this way, an organic-solvent-soluble polyimide A, which has a functional group capable of reacting with epoxy group, and contains 7.4 wt % of a structure represented by the general formula (1), was obtained. When tetrahydrofuran 6 g was added to the obtained polymer 4 g and stirred at 23° C., the polymer was dissolved.

Synthesis Example 2

Synthesis of Organic-Solvent-Soluble Polyimide B

BAHF 18.31 g (0.05 mol), SiDA 7.46 g (0.03 mol) and 3-Aph 4.37 g (0.04 mol) as an end capping agent were dissolved in NMP 150 g under a dried nitrogen flow. To this, 2,2-bis(4-dicarboxyphenoxy)phenyl propane dianhydride (hereunder, referred to as BSM) 52 g (0.1 mol) was added together with NMP 30 g and reacted at 20° C. for one hour, and then stirred at 50° C. for 4 hours. After that, it was stirred at 180° C. for 5 hours. After finishing the stirring, the solution was poured into water 3 liters to obtain a precipitated white polymer. This precipitate was collected by filtration and after washed with water 3 times, it was dried at 80° C. for 20 hours by a vacuum drier. When an infra-red absorption spectrum of the obtained solid polymer was obtained, absorption peaks of an imide structure originated from a polyimide were detected around 1780 cm$^{-1}$ and 1377 cm$^{-1}$. In this way, an organic-solvent-soluble polyimide B, which has a functional group capable of reacting with epoxy group, and contains 8.3 wt % of a structure represented by the general formula (1), was obtained. When tetrahydrofuran 6 g was added to the obtained polymer 4 g and stirred at 23° C., the polymer was dissolved.

Synthesis Example 3

Synthesis of Organic-Solvent-Soluble Polyimide C

BAHF 14.65 g (0.04 mol) and SiDA 9.96 g (0.04 mol) were dissolved in NMP 130 g under a dried nitrogen flow. To this, 2,2-bis(3,4-dicarboxyphenyl) hexafluoropropane dianhydride (hereunder, referred to as 6FDA) 44.42 g (0.1 mol) was added together with NMP 20 g and stirred at 20° C. for one hour, and then it was stirred at 50° C. for 2 hours. To this, as an end capping agent, 3-Aph 3.27 g (0.04 mol) was added and stirred at 50° C. for 2 hours, and then it was stirred at 180° C. for 5 hours. After finishing the stirring, the solution was poured into water 3 liters to obtain a precipitated white polymer. This precipitate was collected by filtration and after washed with water 3 times, it was dried at 80° C. for 20 hours by a vacuum drier. When an infra-red absorption spectrum of the obtained solid polymer was obtained, absorption peaks of an imide structure originated from a polyimide were detected around 1780 cm$^{-1}$ and 1377 cm$^{-1}$. In this way, an organic-solvent-soluble polyimide C, which has a functional group capable of reacting with epoxy group, and contains 12.4 wt % of a structure represented by the general formula (1), was obtained. When tetrahydrofuran 6 g was added to the obtained polymer 4 g and stirred at 23° C., the polymer was dissolved.

Synthesis Example 4

Synthesis of Organic-Solvent-Soluble Polyimide D

BAHF 29.3 g (0.08 mol) and SiDA 4.97 g (0.02 mol) were dissolved in NMP 130 g under a dried nitrogen flow. To this, ODPA 28.54 g (0.092 mol) was added together with NMP 20 g and stirred at 20° C. for one hour, and then stirred at 50° C. for 2 hours. To this, as an end capping agent, 4-hydroxyphthalic anhydride 3.28 g (0.02 mol) was added and stirred at 50° C. for 2 hours. After that, xylene 15 g was added and stirred at 180° C. for 5 hours while water was distilled off azeotoropically together with the xylene. After finishing the stirring, the solution was poured into water 3 liters to obtain a precipitated white polymer. This precipitate was collected by filtration and after washed with water 3 times, it was dried at 80° C. for 20 hours by a vacuum drier. When an infra-red absorption spectrum of the obtained solid polymer was obtained, absorption peaks of an imide structure originated from a polyimide were detected around 1780 cm$^{-1}$ and 1377 cm$^{-1}$. In this way, an organic-solvent-soluble polyimide D, which has a functional group capable of reacting with epoxy group, and contains 14 wt % of a structure represented by the general formula (1), was obtained. When tetrahydrofuran 6 g was added to the obtained polymer 4 g and stirred at 23° C., the polymer was dissolved.

Synthesis Example 5

Synthesis of Organic-Solvent-Soluble Polyimide E

BAHF 29.3 g (0.08 mol) and SiDA 4.97 g (0.02 mol) were dissolved in NMP 130 g under a dried nitrogen flow. To this, ODPA 28.54 g (0.092 mol) was added together with NMP 20 g and stirred at 20° C. for one hour, and then stirred at 50° C. for 2 hours. To this, as an end capping agent, 4-nitrophenyl salicylic acid 5.18 g (0.02 mol) was added and stirred at 50° C. for 2 hours. After that, xylene 15 g was added and stirred at 180° C. for 5 hours while water was distilled off azeotoropically together with the xylene. After finishing the stirring, the solution was poured into water 3 liters to obtain a precipitated white polymer. This precipitate was collected by filtration and after washed with water 3 times, it was dried at 80° C. for 20 hours by a vacuum drier. When an infra-red absorption spectrum of the obtained solid polymer was obtained, absorption peaks of an imide structure originated from a polyimide were detected around 1780 cm$^{-1}$ and 1377 cm$^{-1}$. In this way, an organic-solvent-soluble polyimide E, which has a functional group capable of reacting with epoxy group, and contains 14.2 wt % of a structure represented by the general formula (1), was obtained. When tetrahydrofuran 6 g was added to the obtained polymer 4 g and stirred at 23° C., the polymer was dissolved.

Synthesis Example 6

Synthesis of Organic-Solvent-Soluble Polyimide F

BAHF 18.3 g (0.05 mol) was dissolved in acetone 100 ml and propylene oxide 17.4 g (0.3 mol), and cooled to −15° C. To this, a solution in which 4-nitrobenzoyl chloride 20.4 g (0.11 mol) was dissolved in acetone 100 ml was dropped. After finishing the dropping, it was stirred at −15° C. for 4 hours, and then returned to room temperature. The precipitated white solid was filtered and vacuum dried at 50° C.

The solid 30 g was put into a 300 ml stainless steel autoclave and was dispersed in methyl cellosolve 250 ml, and 5% palladium-carbon 2 g was added. To this, hydrogen was introduced by a balloon to carry out a reduction reaction at room temperature. After 2 hours, the reaction was stopped after confirming that the balloon did not deflate any more. After finishing the reaction, the palladium compound was removed by filtration, and the reaction mixture was concentrated by a rotary evaporator and obtained a diamine compound (II) containing hydroxyl group. The obtained solid was used for reaction as it was.

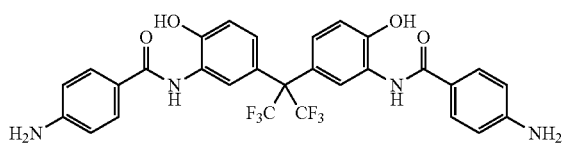

(II)

BAHF 24.54 g (0.067 mol), hydroxyl group containing diamine compound (II) 6.04 g (0.01 mol) and SiDA 2.49 g (0.01 mol) were dissolved in NMP 250 g under a dried nitrogen flow. To this, 2,2-bis(3,4-dicarboxyphenyl)ethylene dianhydride (hereunder, referred to as TMEG-100) 41.03 g (0.1 mol) and, as an end capping agent, 4-aminothiophenol (produced by Tokyo Chemical Industry Co., Ltd.) 4.45 g (0.03 mol) was added and stirred at 60° C. for 6 hours. After that, xylene 15 g was added and stirred at 150° C. for 5 hours while reacted water was distilled off azeotoropically together with the xylene. After finishing the stirring, the solution was poured into water 2 liters to obtain a precipitated white polymer. This precipitate was collected by filtration and after washed with water 3 times, it was dried at 80° C. for 20 hours by a vacuum drier. When an infra-red absorption spectrum of the obtained solid polymer was obtained, absorption peaks of an imide structure originated from a polyimide were detected around 1780 cm$^{1}$ and 1377 cm$^{-1}$. In this way, an organic-solvent-soluble polyimide F, which has a functional group capable of reacting with epoxy group, and contains 2.9 wt % of a structure represented by the general formula (1), was obtained. When tetrahydrofuran 6 g was added to the obtained polymer 4 g and stirred at 23° C., the polymer was dissolved.

Synthesis Example 7

Synthesis of Organic-Solvent-Soluble Polyimide G

BAHF 18.3 g (0.05 mol) and allyl glycidyl ether 39.2 g (0.3 mol) were dissolved in γ-butyrolactone (GBL) 100 g and cooled to −15° C. under a dried nitrogen flow. To this, trimellitic anhydride chloride 22.1 g (0.11 mol) dissolved in GBL 50 g was dropped so that the temperature of the reaction liquid would not exceed 0° C. After finishing the dropping, it was stirred at 0° C. for 4 hours. This solution was concentrated by a rotary evaporator and poured into toluene 1 liter to obtain a hydroxyl group containing acid anhydride (I).

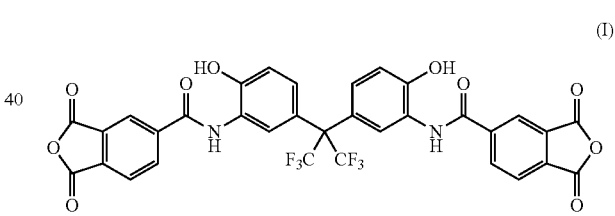

(I)

BAHF 30.03 g (0.082 mol), SiDA 3.73 g (0.015 mol) and, as an end capping agent, 4-aminothiophenol (produced by Tokyo Chemical Industry Co., Ltd.) 4.45 g (0.03 mol) were dissolved in NMP 100 g under a dried nitrogen flow. To this, hydroxyl group containing acid anhydride (I) 71.45 g (0.1 mol) was added together with NMP 30 g and reacted at 20° C. for 1 hour, and then they were reacted at 50° C. for 4 hours. After that, it was stirred at 180° C. for 5 hours. After finishing the stirring, the solution was poured into water 3 liters to obtain a precipitated white polymer. This precipitate was collected by filtration and after washed with water 3 times, it was dried at 200° C. for 5 hours by a vacuum drier. When an infra-red absorption spectrum of the obtained solid polymer was obtained, absorption peaks of an imide structure originated from a polyimide were detected around 1780 cm$^{-1}$ and 1377 cm$^{-1}$. In this way, an organic-solvent-soluble polyimide G, which has a functional group capable of reacting with epoxy group, and contains 3 wt % of a structure represented by the general formula (1), was obtained. When tetrahydrofuran 6 g was added to the obtained polymer 4 g and stirred at 23° C., the polymer was dissolved.

Synthesis Example 8

Synthesis of Organic-Solvent-Soluble Polyimide H

BAHF 25.64 g (0.07 mol), SiDA 4.97 g (0.02 mol), and as an end capping agent, 3-Aph 2.18 g (0.02 mol) were dissolved in NMP 150 g under a dried nitrogen flow. To this, ODPA 15.51 g (0.05 mol), biphenyl tetracarboxylic dianhydride (BPDA) 14.71 g (0.05 mol) were added together with NMP 30 g and reacted at 20° C. for one hour, and then they were reacted at 50° C. for 4 hours. After that, it was stirred at 180° C. for 5 hours. After finishing the stirring, the solution was poured into water 3 liters to obtain a precipitated white polymer. This precipitate was collected by filtration and after washed with water 3 times, it was dried at 80° C. for 20 hours by a vacuum drier. When an infra-red absorption spectrum of the obtained solid polymer was obtained, absorption peaks of an imide structure originated from a polyimide were detected around 1780 $cm^{-1}$ and 1377 $cm^{-1}$. In this way, an organic-solvent-soluble polyimide H, which has a functional group capable of reacting with epoxy group, and contains 7.3 wt % of a structure represented by the general formula (1), was obtained. When tetrahydrofuran 6 g was added to the obtained polymer 4 g and stirred at 23° C., the polymer was dissolved.

Synthesis Example 9

Synthesis of Organic-Solvent-Soluble Polyimide I

BAHF 14.65 g (0.04 mol), SiDA 12.42 g (0.05 mol) and, as an end capping agent, 3-Aph 2.18 g (0.02 mol) were dissolved in NMP 80 g under a dried nitrogen flow. To this, ODPA 31.02 g (0.1 mol) was added together with NMP 20 g, reacted at 20° C. for one hour, and then stirred at 50° C. for 4 hours. After that, xylene 15 g was added and stirred at 180° C. for 5 hours while water was distilled off azeotoropically together with the xylene. After finishing the stirring, the solution was poured into water 3 liters to obtain a precipitated white polymer. This precipitate was collected by filtration and after washed with water 3 times, it was dried at 80° C. for 20 hours by a vacuum drier. When an infra-red absorption spectrum of the obtained solid polymer was obtained, absorption peaks of an imide structure originated from a polyimide were detected around 1780 $cm^1$ and 1377 $cm^{-1}$. In this way, an organic-solvent-soluble polyimide 1, which has a functional group capable of reacting with epoxy group, and contains 19.1 wt % of a structure represented by the general formula (1), was obtained. When tetrahydrofuran 6 g was added to the obtained polymer 4 g and stirred at 23° C., the polymer was dissolved.

Synthesis Example 10

Synthesis of Organic-Solvent-Soluble Polyimide J

BAHF 28.2 g (0.077 mol), SiDA 0.75 g (0.003 mol) and, as an end capping agent, 3-Aph 4.37 g (0.04 mol) were dissolved in NMP 80 g under a dried nitrogen flow. To this, ODPA 31.02 g (0.1 mol) was added together with NMP 20 g and reacted at 20° C. for one hour, and then they were stirred at 50° C. for 4 hours. After that, xylene 15 g was added and stirred at 180° C. for 5 hours while water was distilled off azeotoropically together with the xylene. After finishing the stirring, the solution was poured into water 3 liters to obtain a precipitated white polymer. This precipitate was collected by filtration and after washed with water 3 times, it was dried at 80° C. for 20 hours by a vacuum drier. When an infra-red absorption spectrum of the obtained solid polymer was obtained, absorption peaks of an imide structure originated from a polyimide were detected around 1780 $cm^{-1}$ and 1377 $cm^{-1}$. In this way, an organic-solvent-soluble polyimide J, which has a functional group capable of reacting with epoxy group, and contains 1.1 wt % of a structure represented by the general formula (1), was obtained. When tetrahydrofuran 6 g was added to the obtained polymer 2 g and stirred at 23° C., the polymer was dissolved.

Other than that, each material used in Examples and Comparative examples are as follows.

Solid Epoxy Compound
    Epikote 157S70 (tradename, epoxy equivalent: 210 g/eq, produced by Japan Epoxy Resins Co., Ltd.)
    Epikote 154 (tradename, epoxy equivalent: 180 g/eq, produced by Japan Epoxy Resins Co., Ltd.)
    Epotote YH-434L (tradename, epoxy equivalent: 130 g/eq, produced by Tohto Kasei Co., Ltd.)
    Epikote 1001 (tradename, epoxy equivalent: 460 g/eq, produced by Japan Epoxy Resins Co., Ltd.).

Liquid Epoxy Compound
    Epikote 828 (tradename, epoxy equivalent: 187 g/eq, produced by Japan Epoxy Resins Co., Ltd.)
    Epikote 1750 (tradename, epoxy equivalent: 158 g/eq, produced by Japan Epoxy Resins Co., Ltd.)
    EPICLON HP4032 (tradename, epoxy equivalent: 152 g/eq, produced by Dainippon Ink and Chemicals, Inc.)
    Epikote 152 (tradename, epoxy equivalent: 175 g/eq, produced by Japan Epoxy Resins Co., Ltd.).

Hardening Accelerator
    2-phenyl imidazole (tradename: 2PZ, produced by Shikoku Chemicals Corporation, water insoluble)
    2-ethyl-4-methyl imidazole (tradename: 2E4MZ, produced by Shikoku Chemicals Corporation, water soluble)

Spherical Silica Filler
    SO-E5 (tradename, produced by Admatechs Co., Ltd.)

Carboxylated NBR
    PNR-1 HC (tradename, produced by JSR Corporation)

Solvent: methyl ethyl ketone.

Examples 1 to 6 and Comparative Examples 1 to 6

Each component of Examples 1 to 6 and Comparative examples 1 to 6 was compounded such that their compounding ratios were those shown in Table 1. Here, filler dispersing treatment of the adhesive compositions for semiconductor compounded with the filler was carried out by a ball mill.

Adhesive varnish compositions for semiconductor prepared in compounding ratios of Table 1 were coated by a slit die coater (a coating machine) on polyethylene terephthalate films of 38 μm thickness treated with a silicone-based releasing agent, and dried at 100° C. for 4 minutes. After drying, on the adhesive composition for semiconductor, a polypropylene film of 15 μm thickness was laminated as a plastic film at a hot roll temperature of 40° C., rolled on a paper bobbin of 7.6 cm diameter in a roll state, to obtain an adhesive sheet material for semiconductor (3 layer structure of polypropylene film, adhesive composition layer for semiconductor and polyethylene terephthalate film) having a thickness of the adhesive composition layer for semiconductor of 30 μm.

Determination of the adhesive strength between the obtained plastic film and the adhesive composition layer for semiconductor was carried out in the following way. The adhesive sheet material for semiconductor (3 layer structure of polypropylene film, adhesive composition layer for semiconductor and polyethylene terephthalate film) was cut into 25 mm width and 300 mm length and the cut film was fixed to a 2 mm thickness stainless steel plate with a double-sided sticky material tape with the polyethylene terephthalate film side inside, and the above-mentioned polypropylene film (easily peelable plastic film side) was peeled off from the adhesive composition layer for semiconductor to a direction of angle 90° at a speed of 200 mm/min to measure the adhesive strength (N/m) between the polypropylene film and the adhesive composition layer for semiconductor. Next, the adhesive sheet material for semiconductor after removing the polypropylene film (2 layer structure of the polyethylene terephthalate film and the adhesive composition layer for semiconductor) was cut into 25 mm width and 300 mm length. The cut film was fixed to a 2 mm thickness stainless steel plate with a double-sided sticky material tape with the adhesive composition layer for semiconductor side inside, and the above-mentioned polyethylene terephthalate film (hardly peelable plastic film side) was peeled off from the adhesive composition layer for semiconductor to a direction of angle 90° at a speed of 200 mm/min to measure the adhesive strength (N/m) between the polyethylene terephthalate film and the adhesive composition layer for semiconductor. Results are shown in Table 2. For the measurements of the peeling off and the adhesive strength of the polypropylene film and the polyethylene terephthalate film, all-purpose tester (produced by Orientec Co., Ltd., RTM-100) was used. In the measurement of the adhesive strength, the value measured in gf/cm unit and then converted to N/m unit was taken as the adhesive strength of the present invention. In this unit conversion, the product of the measured value obtained in gf/cm unit expression and 0.98, which is rounded off to a whole number, was taken as the value in N/m unit.

In addition, the light transmittance of the adhesive composition for semiconductor was measured by the following method by using a spectrophotometer (produced by Hitachi, Ltd., U-3210). First, after conducting a measurement calibration (zero-point calibration) for the above-mentioned polyethylene terephthalate film (hardly peelable side plastic film) alone, the light transmittance of the adhesive sheet material for semiconductor after the polypropylene film (easily peelable side plastic film) was removed (the two-layer structure of the hardly peelable side plastic film and the adhesive composition for semiconductor layer) was measured by incidenting a light from the adhesive sheet material for semiconductor side. From the measured value and the thickness of the adhesive sheet material for semiconductor, the light transmittance of the present invention for the adhesive sheet material for semiconductor per 30 μm was calculated. This measurement was carried out for wavelength of 350 nm to 900 nm, and the average value of light transmittance in ±10 nm wavelength from the center of the wavelength which showed maximum light transmittance was taken as the light transmittance value of the present invention. In case where the light transmittance should be evaluated exactly in physical meaning, it is necessary to consider the influence of the interface of the adhesive sheet material for semiconductor and the air, the interface between the polyethylene terephthalate film and the air, the interface between the adhesive sheet material for semiconductor and the polyethylene terephthalate film, and the multiple reflection between these interfaces. In the light transmittance measurement of the present invention, provided that these influences were insignificant, the above-mentioned method was adopted as a simplified method in which these are not considered.

By using the obtained adhesive sheet material for semiconductor, a semiconductor device was prepared in the following way.

1. Lamination Process and Evaluation

For mounting the adhesive sheet material for semiconductor wound in a roll state, to bump electrodes, a laminating device (produced by Technovision Inc., model 900S) was used.

First, the easily peelable side plastic film (e.g., in Example 1, polypropylene film) was removed from the adhesive sheet material for semiconductor and the surface of the adhesive composition for semiconductor was exposed. At this time, by inspecting the presence or absence of a trace of delamination on the surface of the adhesive composition for semiconductor, in addition, by inspecting the presence or absence of a delamination or falling off of the adhesive composition for semiconductor from the hardly peelable side plastic film (e.g., in Example 1, polyethylene terephthalate film), for the respective cases, the case where it is present was taken as x and the case where it is absent was taken as ○. Furthermore, flexibility of the adhesive composition for semiconductor was evaluated by inspecting the presence or absence of a crack of the adhesive composition for semiconductor, or by inspecting the presence or absence of a delamination from the hardly peelable side plastic film, when it is bended in a 5 mm radius of curvature such that the surface of the adhesive composition for semiconductor was positioned outside, and the case where it is present was taken as x and the case where it is absent was taken as ○.

Next, to bump electrodes on a silicon wafer (diameter: 150 mm, thickness: 625 μm), provided with bump electrodes (256 bump/chip, pitch 65 μm, gold plate bump, for liquid crystal driver) of an average height 20 μm, fixed on a laminating device stage, the surface of the adhesive composition for semiconductor of the adhesive sheet material for semiconductor after the easily peelable side plastic film was peeled off was laminated at a temperature 60° C. and a laminating speed 50 cm/min. At this time, the presence or absence of a void or space on surface and in cross-section of the adhesive composition for semiconductor was inspected by a microscope (20 times magnification), and the presence or absence of a void or space around the bump electrodes and in the interface between the adhesive composition for semiconductor and the silicon wafer was inspected, and the case where it is absent was taken as x and other than that was taken as ○. Excessive adhesive composition for semiconductor around the semiconductor wafer was cut off by a cutter blade, and a semiconductor wafer to which the bump electrodes provided with a plastic film (e.g., in Example 1, polyethylene terephthalate film) was mounted with the adhesive material for semiconductor was obtained.

2. Dicing Process and Evaluation

The mounting of the semiconductor wafer obtained by the above-mentioned 1 to a tape frame and dicing tape was carried out by laminating a dicing tape (produced by Lintec Corporation, D-650) to the wafer substrate surface which is opposite side of the bump electrode by a wafer mounter device (produced by Technovision Inc., FM-1146-DF). Next, remaining plastic film was removed. An alignment was carried out by a CCD camera equipped with a microscope by fixing the tape frame such that the surface of the adhesive composition for semiconductor was positioned upside on a cutting stage of the dicing device (produced by Disco Corporation, DFD-6240). The alignment was carried out by two methods in which it is aligned with the bump electrodes aligned on the semiconductor wafer and in which it is aligned with alignment marks on the surface of the semiconductor wafer. At this time, a case where all alignment marks of the bump electrodes or of the surface of the semiconductor wafer were detected was taken as ○, and a case where they were not detected at all was taken as x. The results were shown in the detection ability of alignment marks in dicing process of the table. Further, it took twice as much time as in Examples 1 to 4 and Example 7 to detect alignment marks in Examples 5 and 6.

A schematic diagram of this alignment marks was shown in FIG. 2. Code 7 is a crossed alignment mark, its character thickness (20 μm) is shown as Code 8 and its character length (140 μm) is shown as Code 9. Code 10 is a circular alignment mark and its diameter (100 μm) is shown as Code 11. Code 12 is a square alignment mark, and short side length of the square (10 μm) is shown as Code 13 and long side length of the square (50 μm) is shown as Code 14. Code 15 is an alignment mark of equilateral triangle and side length of the equilateral triangle (30 μm) is shown as Code 16.

Next, Dicing was carried out in the following cutting conditions.

Dicing equipment: DFD-6240 (produced by Disco Corporation)
Semiconductor chip size: 2.5×16.5 mm
Blade: NBC-ZH 127F-SE 27HCCC
Spindle rotational speed: 25000 rpm
Dicing speed: 50 mm/s
Cutting thickness: cut into 20 μm thickness in dicing tape
Cut method: one path full cut
Cutting mode: down cut
Amount of water spraying to blade: 3.7 liter/min
Water spraying to blade and cooling water: temperature 23° C., electric conductivity 0.5 MΩ·cm (carbon dioxide is injected to an ultra-pure water)

For a semiconductor wafer to which bump electrodes are mounted with the adhesive composition for semiconductor which was singulated by dicing (semiconductor chip), the presence or absence of a deposition of dicing dust to surface of the adhesive composition for semiconductor, the presence or absence of a crack or defect of surface of the adhesive composition for semiconductor and the presence or absence of a delamination of the adhesive layer from wafer were inspected by a microscope. As for the deposition of dicing dust, those with no deposition of dicing dust on surface of the adhesive composition for semiconductor were taken as ○, those with the deposition were taken as x. Results were shown in the stain resistance ability in Table 2. And, for the crack, defect, delamination of the adhesive composition for semiconductor from the wafer, a case in which a length of crack, defect and delamination from the wafer of the adhesive composition for semiconductor from the diced edge of the adhesive composition for semiconductor is 25 μm or less was taken as ○, a case in which it exceeds 25 μm was taken as x. Results were shown in the defect formation scratching resistance in Tables 2 to 8. A schematic diagrams of the crack, defect and delamination from the wafer were shown in FIG. 1. Code 1 is a part of semiconductor wafer coated with the composition, and crack defect portion generated in the adhesive composition was shown as Code 2, and crack was shown as Code 3. And, for determining the size of crack or defect of the adhesive composition, the size of crack defect 2 or crack 3 is shown as length of the defect portion shown as Code 4. And, Code 5 denotes a diced edge, Code 6 denotes the longest portion of the defect.

3. Flip Chip Bonding and Evaluation

For connecting the semiconductor chip, to which the bump electrodes prepared in the above-mentioned 2 were mounted with the adhesive composition for semiconductor to a circuit substrate, a flip chip bonding device (produced by Trytech, Inc., DB-100) was used. Further, a polyimide film of 50 μm thickness provided with pad electrodes plated with tin of 9 μm thickness was used as a circuit substrate. An alignment was carried out such that the bump electrodes on the semiconductor chip prepared in the above-mentioned 2 and the pad electrodes on the polyimide film circuit substrate provided with the pad electrode were overlapped. At this time, a case where all bump electrodes or all alignment marks on surface of the semiconductor wafer could be detected was taken as ○, a case where they could not detect at all was taken as x. Results were shown in the alignment marks detection in bonding process in Table.

After the alignment, a flip chip bonding was carried out in a condition of temperature 200° C., time 20 s and pressure 0.4 MPa. By this way, a circuit substrate provided with semiconductor in which semiconductor chips are mounted on a polyimide film circuit substrate was obtained. After finishing the bonding, by seeing through from the side of the polyimide film on which semiconductor chips were not mounted, the presence or absence of space or void of the mounted semiconductor chip was confirmed by observing surface and cross-section of the adhesive composition for semiconductor by a microscope (20 times magnification). Cases where a space or void is present were taken as x, cases other than that were taken as ○. Results were shown in the connectability in Table.

When the samples after the flip chip bonding of Examples 1 to 6 were observed by microscope, from the direction perpendicular to the interface between the semiconductor and the circuit substrate, and bulging out of the adhesive from the semiconductor chip was evaluated, it was found that the bulging out was very small such that the bulging out was 0.2 mm at its largest point.

4. Evaluation of Electric Connectivity (Initial Electric Connectivity and after Heat Impact Test)

Initial electric connectivity and the electric connectivity after heat impact test of the circuit substrate provided with semiconductor prepared in the above-mentioned 3 were evaluated. Evaluation of the electric connectivity was carried out by using a digital multimeter (produced by Advantest K.K., TR6847). For the initial electric connectivity, 20 pieces of the circuit substrate provided with semiconductor prepared in the above-mentioned 3 were evaluated, and, when a bad connectivity (resistivity value is infinite and disconnected) was found even in one position, it was taken as bad, and number of bad products per 20 circuit substrates provided with semiconductor was shown in Table 2. In the heat impact test, the products good in the above-mentioned initial electric connectivity test were evaluated. By taking it as one cycle that the circuit substrate provided with semiconductor was kept at −40° C. for 5 minutes and then kept at 125° C. for 5 minutes, electric connectivity of the circuit substrate provided with semiconductor after carrying out 1,000 cycles was evaluated. For 20 products good in the initial electric connectivity test, evaluations were carried out and when a bad connectivity (resistivity value is infinite and disconnected) was found even in one position, it was taken as bad, and number of bad products per 20 circuit substrates provided with semiconductor was shown in Table 2.

5. Liquid Crystal Panel Displaying Test

The circuit substrate provided with semiconductor after the heat impact test evaluation of the above-mentioned 4 was set in a liquid crystal panel to prepare a semiconductor device and a display test was carried out. Those in which an image was displayed were taken as ○, those other than that or those in which a noise was generated were taken as x.

Example 7

An adhesive sheet material for semiconductor was obtained in the same way as Example 1 except that an adhesive varnish composition for semiconductor prepared in the composition ratio of Table 1 was used, and as a plastic film, the polypropylene film was changed to a polyethylene terephthalate film of 38 μm thickness treated with a silicone-based releasing agent.

Example 8

An adhesive sheet material for semiconductor was obtained in the same way as Example 1 except that an adhesive varnish composition for semiconductor prepared in the composition ratio of Table 1 was used, and as a plastic film to be coated, a polyethylene terephthalate film of 38 μm thickness.

Varnish compositions of Examples 1 to 8 and Comparative examples 1 to 6 were shown in Table 1 and evaluation results were shown in Table 2.

Example 9

An adhesive varnish composition for semiconductor was prepared in the same way as Example 1, in the composition ratio described in Table 3. This adhesive varnish composition for semiconductor was coated, by using a slit die coater (a coating device), on a surface which was not treated hydrophilically of an unstretched polypropylene film (tradename, Torayfan NO, product number ZK-99, produced by Toray Industries, Inc.) of thickness 80 μm, and then dried at 75° C. for 4 minutes. On the dried adhesive composition for semiconductor, as a plastic film, untreated surface of a biaxially stretched polypropylene film (tradename, Torayfan BO, product number YK57) of 15 μm thickness was superposed, laminated at a hot roll temperature of 40° C. and wound on a paper bobbin of 7.6 cm diameter in a roll state to obtain an adhesive sheet material for semiconductor in which the thickness of adhesive layer for semiconductor was 30 μm.

By using the obtained adhesive sheet material for semiconductor, an evaluation was carried out in the same way as Example 1 except that a silicon wafer of 150 mm diameter and 550 μm thickness was used as the silicon wafer provided with bump electrodes (256 bump/chip, pitch 65 μm, gold plate bump, for liquid crystal driver) of an average height of 20 μm used in the above-mentioned 1. Results were shown in Table 3.

Examples 10 to 121 and Comparative Examples 7 to 64

Adhesive varnish compositions for semiconductor were prepared in the same way as Example 1 in the composition ratios described in Table 3 to 14. Adhesive sheet materials for semiconductor were obtained in the same way as Example 9 by coating the each adhesive varnish composition for semiconductor to films. They were evaluated in the same way as Example 9, and the obtained results were shown in Tables 3 to 14.

As for Examples 9 to 121 and Comparative examples 7 to 64, raw materials used in each example were shown in the following.

Organic-Solvent-Soluble Polyimide
　Organic-solvent-soluble polyimide A (above-mentioned synthetic product)
　Organic-solvent-soluble polyimide B (above-mentioned synthetic product)
　Organic-solvent-soluble polyimide C (above-mentioned synthetic product)
　PI-101 (tradename, produced by Maruzen Petrochemical Co., Ltd.), by the way, when tetrahydrofuran 6 g was added to PI-101 4 g and stirred at 23° C., it was dissolved.

Solid Epoxy Compound
　Epikote 157S70 (tradename, epoxy equivalent: 210 g/eq, produced by Japan Epoxy Resins Co., Ltd.)
　Epiclon HP-7200H (tradename, epoxy equivalent: 280 g/eq, produced by Dainippon Ink and Chemicals, Inc.).

Liquid Epoxy Compound
　Epikote 828 (tradename, epoxy equivalent: 187 g/eq, produced by Japan Epoxy Resins Co. Ltd.)
　Epikote YX8000 (tradename, epoxy equivalent: 205 g/eq, produced by Japan Epoxy Resins Co., Ltd.).

Hardening Accelerator
　2PZ (tradename, produced by Shikoku Chemicals Corporation, water insoluble)
　2E4MZ (tradename, produced by Shikoku Chemicals Corporation, water soluble)

Solvent: methyl ethyl ketone, tetrahydrofuran and n-propyl alcohol.

Examples 122 to 141 and Comparative Examples 65 to 84

By using the adhesive varnish compositions for semiconductor prepared based on the composition ratios of Tables 15 to 16, they were evaluated in the same way as Example 9, except changing the flip chip bonding time of the above-mentioned 3 to 60 s.

The varnish compositions of Examples 122 to 141 and Comparative examples 65 to 84 and their evaluation results were shown in Tables 15 to 16.

When preparing samples and their evaluations were conducted in the same way except changing the polyimide A used in Examples 39 to 59, 102 to 121, 122 to 141 and Comparative examples 27 to 32, 45 to 64 and 65 to 84 to the organic-solvent-soluble polyimide D, results similar to those of Examples 39 to 59, 102 to 121, 122 to 141 and Comparative examples 27 to 32, 45 to 64 and 65 to 84 were obtained.

When preparing samples and their evaluation were conducted in the same way except changing polyimide A used in Examples 39 to 59, 102 to 121, 122 to 141 and Comparative examples 27 to 32, 45 to 64, 65 to 84 to the organic-solvent-soluble polyimide E, results similar to those of Examples 39 to 59, 102 to 121, 122 to 141 and Comparative examples 27 to 32, 45 to 64, 65 to 84 were obtained.

When preparing samples and their evaluation were conducted in the same way except changing polyimide A used in Examples 39 to 59, 102 to 121, 122 to 141 and Comparative examples 27 to 32, 45 to 64 and 65 to 84 to the organic-solvent-soluble polyimide F, results similar to those of Examples 39 to 59, 102 to 121, 122 to 141 and Comparative examples 27 to 32, 45 to 64 and 65 to 84 were obtained.

When preparing samples and their evaluation were conducted in the same way except changing polyimide A used in Examples 39 to 59, 102 to 121, 122 to 141 and Comparative examples 27 to 32, 45 to 64, 65 to 84 to organic-solvent-soluble polyimide G, results similar to those of Examples 39 to 59, 102 to 121, 122 to 141 and Comparative examples 27 to 32, 45 to 64, 65 to 84 were obtained.

When preparing samples and their evaluation were carried out in the same way except changing polyimide A used in Examples 39 to 59, 102 to 121, 122 to 141 and Comparative examples 27 to 32, 45 to 64, 65 to 84 to the organic-solvent-soluble polyimide H, results similar to those of Examples 39 to 59, 102 to 121, 122 to 141 and Comparative examples 27 to 32, 45 to 64, 65 to 84 were obtained.

Examples 142 and 143

Adhesive varnish compositions for semiconductor were prepared in the same way as Example 1 in the compositions described in Table 17. The obtained each adhesive varnish composition for semiconductor was coated on film in the same way as Example 9, and adhesive sheet materials for semiconductor were obtained. They were evaluated in the same way as Example 9, and the obtained results were shown in Table 17.

Example 144

An adhesive varnish composition for semiconductor was prepared in the same way as Example 1 in the composition ratio described in Example 40 of Table 7. This adhesive varnish composition for semiconductor was coated, by using a slit die coater (a coating device), on a surface of an unstretched polypropylene film (tradename, Torayfan NO, Product number ZK-99, produced by Toray Industries, Inc.) of a thickness 80 μm which was not treated hydrophilically, and then dried at 75° C. for 4 minutes. On the dried adhesive composition for semiconductor, a plastic base film (tradename, BGE-124S, produced by Toyo Adtec, Inc.), on which a sticky material layer of 160 μm thickness was formed, was laminated such that the sticky material layer surface adhered to the adhesive composition for semiconductor, at a hot roll temperature of 25° C., and wound on a paper bobbin of 7.6 cm diameter in a roll state. By this way, an adhesive sheet material for semiconductor, in which 4 layers of polypropylene film, adhesive composition layer for semiconductor, sticky material layer and plastic film were laminated in this order, which has both of a backgrind tape function and a semiconductor adhering function, was obtained.

The adhesive strength measurement between each material was carried out in the following way. The adhesive sheet material for semiconductor (4 layer structure of polypropylene film, an adhesive composition layer for semiconductor, a sticky material layer and a base film) was cut into 25 mm width and 300 mm length and the cut film was fixed to a 2 mm thickness stainless steel plate with a double-sided sticky material tape with the polyethylene terephthalate film side inside, and the above-mentioned polypropylene film (easily peelable plastic film side) was peeled off from the adhesive composition layer for semiconductor to a direction of angle 90° at a speed 200 mm/min to measure the adhesive strength between the polypropylene film and the adhesive composition layer for semiconductor. The adhesive strength was 14 N/m. Next, the adhesive sheet material for semiconductor after removing polypropylene film (3 layer stricture of the base film, the sticky material layer and the adhesive composition layer for semiconductor) was cut into 25 mm width and 300 mm length and the cut film was fixed to a 2 mm thickness stainless steel plate with a double-sided sticky material tape with the adhesive composition layer for semiconductor side inside, and the above-mentioned base film with the sticky material layer (hardly peelable plastic film side) was peeled off from the adhesive composition layer for semiconductor to a direction of angle 90° at a speed 200 mm/min to measure the adhesive strength (N/m) between the sticky material layer and the adhesive composition layer for semiconductor. As a result, it was 45 N/m.

For the mounting of the adhesive sheet material for semiconductor, wound in a roll state, which had both of backgrind tape function and semiconductor adhering function, to the bump electrodes, a laminating device (produced by Technovision Inc., model 900S) was used.

To the bump electrodes of the silicon wafer (diameter 150 mm, thickness 625 μm) provided with bump electrodes (256 bump/chip, pitch 65 μm, gold plate bump, for liquid crystal driver) of 20 μm average height, fixed on a laminating device stage, the surface of the adhesive composition for semiconductor, of which polypropylene film, the easily peelable side plastic film, had been peeled off, of the adhesive sheet material for semiconductor was laminated at a temperature of 60° C. and laminating speed of 50 cm/min. Excessive adhesive composition for semiconductor around the semiconductor wafer was cut off by a cutter blade. In this way, a semiconductor wafer mounted with electrodes with the adhesive for semiconductor, in which a sticky material layer and a base film are laminated in this order on the adhesive for semiconductor, was obtained.

Next, the opposite side of the bump electrode of the semiconductor wafer was, by using a cutting-polishing device (produced by Disco Corporation, DGP-8760), subjected to a cutting•polishing so that the thickness of the semiconductor wafer would be 100 μm. Then, the base film provided with the sticky material layer was peeled off from the adhesive for semiconductor.

After that, when 2. dicing process, 3. flip chip bonding, 4. evaluation of electric connectivity, 5. liquid crystal display test of Example 1 were carried out, and similar results as Example 40 were obtained.

TABLE 1

| | | Examples | | | | | | | | Comparative examples | | | | | |
|---|---|---|---|---|---|---|---|---|---|---|---|---|---|---|---|
| | | 1 | 2 | 3 | 4 | 5 | 6 | 7 | 8 | 1 | 2 | 3 | 4 | 5 | 6 |
| Adhesive composition (Weight parts) | Organic-solvent-soluble polyimide A | 50 | 70 | | | 50 | | | 50 | 50 | 50 | 95 | 10 | 50 | 50 |
| | Organic-solvent-soluble polyimide B | | | | 30 | | | 50 | | | | | | | | |
| | Organic-solvent-soluble polyimide C | | | | | | 25 | | | 50 | | | | | | |
| | Solid epoxy compound | Epikote 157S70 | 50 | | | | | | | 50 | 50 | 90 | | 50 | 50 | 50 | 50 |
| | | Epikote 154 | | 70 | | | | | | | | | | | | | |
| | | Epotote YH-434L | | | 50 | | | | 50 | | | | | | | | |
| | | Epikote 1001 | | | | 50 | 40 | | | | | | | | | | |
| | Liquid epoxy compound | Epikote 828 | 50 | | | | | | | 50 | 50 | 10 | 100 | 50 | 50 | 50 | 50 |
| | | EPICLON HP-4032 | | 30 | | | | | | | | | | | | | |
| | | Epikote 1750 | | | | 50 | | | 50 | | | | | | | | |
| | | Epikote 152 | | | | | | 50 | 60 | | | | | | | | |

TABLE 1-continued

|  |  | Examples | | | | | | | | Comparative examples | | | | | |
| --- | --- | --- | --- | --- | --- | --- | --- | --- | --- | --- | --- | --- | --- | --- | --- |
|  |  | 1 | 2 | 3 | 4 | 5 | 6 | 7 | 8 | 1 | 2 | 3 | 4 | 5 | 6 |
| Hardening accelerator | 2PZ (Water insoluble) | 5 | 5 | 5 | 5 | 5 |  | 5 | 5 | 6 | 6 | 6 | 6 |  | 30 |
|  | 2E4MZ (Water soluble) |  |  |  |  |  | 6 |  |  |  |  |  |  |  |  |
| Spherical silica filler |  |  |  |  |  | 10 | 10 |  |  |  |  |  |  |  |  |
| Carboxylated NBR |  |  |  |  |  | 2 | 2 |  |  |  |  |  |  |  |  |
| Methyl ethyl ketone |  | 150 | 170 | 150 | 130 | 170 | 170 | 150 | 150 | 150 | 150 | 200 | 120 | 150 | 180 |

TABLE 2

|  |  | Examples | | | | | | | | Comparative examples | | | | | |
| --- | --- | --- | --- | --- | --- | --- | --- | --- | --- | --- | --- | --- | --- | --- | --- |
|  |  | 1 | 2 | 3 | 4 | 5 | 6 | 7 | 8 | 1 | 2 | 3 | 4 | 5 | 6 |
| Light transmittance (%) |  | 99 | 99 | 99 | 99 | 75 | 75 | 99 | 99 | 99 | 99 | 98 | 99 | 99 | 97 |
| Adhesive strength with the polypropylene film (N/m) |  | 4 | 4 | 5 | 3 | 5 | 5 | 9 | 4 | 3 | 9 | 2 | 9 | 5 | 4 |
| Adhesive strength with the polyethylene terephthalate film (N/m) |  | 10 | 10 | 12 | 10 | 20 | 20 | 10 | 69 | 9 | 14 | 5 | 14 | 14 | 14 |
| Lamination Process | Delamination | ○ | ○ | ○ | ○ | ○ | ○ | x | ○ | ○ | ○ | x | ○ | ○ | ○ |
|  | Flexibility | ○ | x | ○ | ○ | ○ | ○ | ○ | ○ | x | ○ | ○ | ○ | ○ | x |
|  | Laminatability | ○ | ○ | ○ | ○ | ○ | ○ | ○ | ○ | ○ | ○ | ○ | ○ | ○ | x |
| Dicing Process | Alignment mark detectability | ○ | ○ | ○ | ○ | ○ | ○ | ○ | ○ | ○ | ○ | ○ | ○ | ○ | ○ |
|  | Dicing processability (Stain resistance) | ○ | ○ | ○ | x | ○ | ○ | ○ | ○ | ○ | x | x | x | x | x |
|  | Dicing processability (Defect formation resistance) | ○ | x | ○ | ○ | ○ | ○ | ○ | ○ | x | x | x | x | x | x |
| Bonding Process | Alignment mark detectability | ○ | ○ | ○ | ○ | ○ | ○ | ○ | ○ | ○ | ○ | ○ | ○ | ○ | ○ |
|  | Electric connectivity | ○ | ○ | ○ | ○ | ○ | ○ | ○ | ○ | ○ | ○ | x | ○ | ○ | x |
| Electric connectivity evaluation | Initial electric connectivity | 0/20 | 1/20 | 0/20 | 1/20 | 0/20 | 5/20 | 0/20 | 1/20 | 10/20 | 10/20 | 15/20 | 10/20 | 20/20 | 20/20 |
|  | Electric connectivity after the heat impact test | 0/20 | 0/20 | 0/20 | 0/20 | 0/20 | 0/20 | 0/20 | 0/20 | 20/20 | 20/20 | 20/20 | 20/20 | 20/20 | 20/20 |
| Semiconductor device evaluation | Liquid crystal panel displaying test | ○ | ○ | ○ | ○ | ○ | ○ | ○ | ○ | x | x | x | x | x | x |

TABLE 3

|  |  | Examples | | | | | | | | | | | | | | |
| --- | --- | --- | --- | --- | --- | --- | --- | --- | --- | --- | --- | --- | --- | --- | --- | --- |
|  |  | 9 | 10 | 11 | 12 | 13 | 14 | 15 | 16 | 17 | 18 | 19 | 20 | 21 | 22 | 23 |
| Adhesive composition (Weight parts) | Organic-solvent-soluble polyimide PI-101 | 20 | 30 | 50 | 65 | 85 | 20 | 30 | 50 | 65 | 85 | 20 | 30 | 50 | 65 | 85 |
|  | Solid epoxy compound Epikote 157S70 | 50 | 50 | 50 | 50 | 50 | 80 | 80 | 80 | 80 | 80 | 40 | 40 | 40 | 40 | 40 |
|  | Liquid epoxy compound Epikote 828 | 50 | 50 | 50 | 50 | 50 | 20 | 20 | 20 | 20 | 20 | 60 | 60 | 60 | 60 | 60 |
|  | Hardening accelerator 2PZ (Water insolble) | 5 | 5 | 5 | 5 | 5 | 5 | 5 | 5 | 5 | 5 | 5 | 5 | 5 | 5 | 5 |
|  | n-propyl alcohol | 10 | 10 | 10 | 10 | 10 | 10 | 10 | 10 | 10 | 10 | 10 | 10 | 10 | 10 | 10 |
|  | Tetrahydrofuran | 95 | 100 | 145 | 160 | 230 | 95 | 100 | 145 | 160 | 230 | 95 | 100 | 145 | 160 | 180 |
| Light transmittance (%) |  | 99 | 99 | 99 | 99 | 99 | 99 | 99 | 99 | 99 | 99 | 99 | 99 | 99 | 99 | 99 |
| Biaxially stretched polypropylene film (N/m) |  | 6 | 6 | 5 | 6 | 4 | 6 | 6 | 5 | 5 | 4 | 9 | 9 | 8 | 7 | 6 |
| Unstretched polypropylene film (N/m) |  | 15 | 14 | 13 | 13 | 11 | 14 | 14 | 12 | 12 | 10 | 16 | 16 | 14 | 13 | 12 |
| Lamination Process | Delamination | ○ | ○ | ○ | ○ | ○ | ○ | ○ | ○ | ○ | ○ | ○ | ○ | ○ | ○ | ○ |
|  | Flexibility | ○ | ○ | ○ | ○ | ○ | ○ | ○ | x | x | x | ○ | ○ | ○ | ○ | ○ |
|  | Laminatability | ○ | ○ | ○ | ○ | ○ | ○ | ○ | ○ | ○ | ○ | ○ | ○ | ○ | ○ | ○ |
| Dicing Process | Alignment mark detectability | ○ | ○ | ○ | ○ | ○ | ○ | ○ | ○ | ○ | ○ | ○ | ○ | ○ | ○ | ○ |
|  | Dicing processability (Stain resistance) | x | ○ | ○ | ○ | ○ | ○ | ○ | ○ | ○ | ○ | x | x | x | ○ | ○ |
|  | Dicing processability (Defect formation resistance) | ○ | ○ | ○ | ○ | x | x | x | x | x | x | ○ | ○ | ○ | x | x |
| Bonding Process | Alignment mark detectability | ○ | ○ | ○ | ○ | ○ | ○ | ○ | ○ | ○ | ○ | ○ | ○ | ○ | ○ | ○ |
|  | Electric connectivity | ○ | ○ | ○ | ○ | ○ | ○ | ○ | ○ | ○ | ○ | ○ | ○ | ○ | ○ | ○ |

TABLE 3-continued

| | | Examples | | | | | | | | | | | | | |
|---|---|---|---|---|---|---|---|---|---|---|---|---|---|---|---|
| | | 9 | 10 | 11 | 12 | 13 | 14 | 15 | 16 | 17 | 18 | 19 | 20 | 21 | 22 | 23 |
| Electric connectivity evaluation | Initial electirc connectivity | 4/20 | 3/20 | 3/20 | 3/20 | 4/20 | 4/20 | 4/20 | 4/20 | 4/20 | 4/20 | 4/20 | 4/20 | 4/20 | 4/20 | 4/20 |
| | Electric connectivity after the heat impact test | 3/20 | 3/20 | 3/20 | 3/20 | 3/20 | 3/20 | 3/20 | 3/20 | 3/20 | 3/20 | 3/20 | 3/20 | 3/20 | 3/20 | 3/20 |
| Semiconductor device evaluation | Liquid crystal panel displaying test | ○ | ○ | ○ | ○ | ○ | ○ | ○ | ○ | ○ | ○ | ○ | ○ | ○ | ○ | ○ |

TABLE 4

| | | Comparative examples | | | | | | | | | |
|---|---|---|---|---|---|---|---|---|---|---|---|
| | | 7 | 8 | 9 | 10 | 11 | 12 | 13 | 14 | 15 | 16 |
| Adhesive composition (Weight parts) | Organic-solvent-soluble polyimide PI-101 | 95 | 10 | 20 | 50 | 85 | 20 | 50 | 85 | 50 | 50 |
| | Solid epoxy compound Epikote 157S70 | 50 | 50 | 90 | 90 | 90 | 35 | 35 | 35 | 50 | 50 |
| | Liquid epoxy compound Epikote 828 | 50 | 50 | 10 | 10 | 10 | 65 | 65 | 65 | 50 | 50 |
| | Hardening accelerator 2PZ (Water insolble) | 5 | 5 | 5 | 5 | 5 | 5 | 5 | 5 | — | 30 |
| | n-propyl alcohol | 10 | 10 | 10 | 10 | 10 | 10 | 10 | 10 | 10 | 30 |
| | Tetrahydrofuran | 190 | 105 | 115 | 145 | 180 | 115 | 145 | 180 | 140 | 150 |
| | Light transmittance (%) | 99 | 99 | 99 | 99 | 99 | 99 | 99 | 99 | 99 | 99 |
| Biaxially stretched polypropylene film (N/m) | | 3 | 5 | 3 | 2 | 2 | 10 | 9 | 6 | 5 | 3 |
| Unstretched polypropylene film (N/m) | | 9 | 13 | 6 | 5 | 3 | 14 | 14 | 12 | 12 | 12 |
| Lamination Process | Delamination | ○ | ○ | x | x | x | x | ○ | ○ | ○ | ○ |
| | Flexibility | x | ○ | x | x | x | x | ○ | ○ | ○ | x |
| | Laminatability | x | ○ | ○ | ○ | x | ○ | ○ | ○ | ○ | x |
| Dicing Process | Alignment mark detectability | ○ | ○ | ○ | ○ | ○ | ○ | ○ | ○ | ○ | ○ |
| | Dicing processability (Stain resistance) | ○ | x | ○ | ○ | ○ | x | x | x | x | x |
| | Dicing processability (Defect formation resistance) | x | x | x | x | x | x | x | x | x | x |
| Bonding Process | Alignment mark detectability | ○ | ○ | ○ | ○ | ○ | ○ | ○ | ○ | ○ | ○ |
| | Electric connectivity | x | ○ | ○ | ○ | x | ○ | ○ | ○ | ○ | x |
| Electric connectivity evaluation | Initial electirc connectivity | 15/20 | 15/20 | 15/20 | 15/20 | 15/20 | 15/20 | 15/20 | 15/20 | 20/20 | 20/20 |
| | Electric connectivity after the heat impact test | 20/20 | 20/20 | 20/20 | 20/20 | 20/20 | 20/20 | 20/20 | 20/20 | 20/20 | 20/20 |
| Semiconductor device evaluation | Liquid crystal panel displaying test | x | x | x | x | x | x | x | x | x | x |

TABLE 5

| | | Examples | | | | | | | | | | | | | | |
|---|---|---|---|---|---|---|---|---|---|---|---|---|---|---|---|---|
| | | 24 | 25 | 26 | 27 | 28 | 29 | 30 | 31 | 32 | 33 | 34 | 35 | 36 | 37 | 38 |
| Adhesive composition (Weight parts) | Organic-solvent-soluble polyimide PI-101 | 20 | 30 | 50 | 65 | 85 | 20 | 30 | 50 | 65 | 85 | 20 | 30 | 50 | 65 | 85 |
| | Solid epoxy compound Epikote Epiclon HP-7200H | 50 | 50 | 50 | 50 | 50 | 80 | 80 | 80 | 80 | 80 | 40 | 40 | 40 | 40 | 40 |
| | Liquid epoxy compound Epikote YX8000 | 50 | 50 | 50 | 50 | 50 | 20 | 20 | 20 | 20 | 20 | 60 | 60 | 60 | 60 | 60 |
| | Hardening accelerator 2PZ (Water insolble) | 5 | 5 | 5 | 5 | 5 | 5 | 5 | 5 | 5 | 5 | 5 | 5 | 5 | 5 | 5 |
| | n-propyl alcohol | 10 | 10 | 10 | 10 | 10 | 10 | 10 | 10 | 10 | 10 | 10 | 10 | 10 | 10 | 10 |
| | Tetrahydrofuran | 95 | 100 | 145 | 160 | 230 | 95 | 100 | 145 | 160 | 230 | 95 | 100 | 145 | 160 | 180 |
| Light transmittance (%) | | 99 | 99 | 99 | 99 | 99 | 99 | 99 | 99 | 99 | 99 | 99 | 99 | 99 | 99 | 99 |
| Biaxially stretched polypropylene film (N/m) | | 16 | 16 | 15 | 16 | 14 | 16 | 16 | 15 | 15 | 14 | 19 | 19 | 18 | 17 | 16 |
| Unstretched polypropylene film (N/m) | | 25 | 24 | 23 | 23 | 21 | 24 | 24 | 22 | 22 | 20 | 25 | 25 | 24 | 23 | 22 |
| Lamination Process | Delamination | ○ | ○ | ○ | ○ | ○ | ○ | ○ | ○ | ○ | ○ | ○ | ○ | ○ | ○ | ○ |
| | Flexibility | ○ | ○ | ○ | ○ | ○ | ○ | ○ | x | x | x | ○ | ○ | ○ | ○ | ○ |
| | Laminatability | ○ | ○ | ○ | ○ | ○ | ○ | ○ | ○ | ○ | ○ | ○ | ○ | ○ | ○ | ○ |
| Dicing Process | Alignment mark detectability | ○ | ○ | ○ | ○ | ○ | ○ | ○ | ○ | ○ | ○ | ○ | ○ | ○ | ○ | ○ |
| | Dicing processability (Stain resistance) | x | ○ | ○ | ○ | ○ | ○ | ○ | ○ | ○ | ○ | x | x | x | ○ | ○ |

TABLE 5-continued

|  |  | Examples |  |  |  |  |  |  |  |  |  |  |  |  |  |
|---|---|---|---|---|---|---|---|---|---|---|---|---|---|---|---|
|  |  | 24 | 25 | 26 | 27 | 28 | 29 | 30 | 31 | 32 | 33 | 34 | 35 | 36 | 37 | 38 |
|  | Dicing processability (Defect formation resistance) | ○ | ○ | ○ | ○ | x | x | x | x | x | x | ○ | ○ | ○ | x | x |
| Bonding Process | Alignment mark detectability | ○ | ○ | ○ | ○ | ○ | ○ | ○ | ○ | ○ | ○ | ○ | ○ | ○ | ○ | ○ |
|  | Electric connectivity | ○ | ○ | ○ | ○ | ○ | ○ | ○ | ○ | ○ | ○ | ○ | ○ | ○ | ○ | ○ |
| Electric connectivity evaluation | Initial electirc connectivity | 4/20 | 3/20 | 3/20 | 3/20 | 4/20 | 4/20 | 4/20 | 4/20 | 4/20 | 4/20 | 4/20 | 4/20 | 4/20 | 4/20 | 4/20 |
|  | Electric connectivity after the heat impact test | 3/20 | 3/20 | 3/20 | 3/20 | 3/20 | 3/20 | 3/20 | 3/20 | 3/20 | 3/20 | 3/20 | 3/20 | 3/20 | 3/20 | 3/20 |
| Semiconductor device evaluation | Liquid crystal panel displaying test | ○ | ○ | ○ | ○ | ○ | ○ | ○ | ○ | ○ | ○ | ○ | ○ | ○ | ○ | ○ |

TABLE 6

|  |  | Comparative examples |  |  |  |  |  |  |  |  |  |
|---|---|---|---|---|---|---|---|---|---|---|---|
|  |  | 17 | 18 | 19 | 20 | 21 | 22 | 23 | 24 | 25 | 26 |
| Adhesive composition (Weight parts) | Organic-solvent-soluble polyimide PI-101 | 95 | 10 | 20 | 50 | 85 | 20 | 50 | 85 | 50 | 50 |
|  | Solid epoxy compound Epikote Epiclon HP-7200H | 50 | 50 | 90 | 90 | 90 | 35 | 35 | 35 | 50 | 50 |
|  | Liquid epoxy compound Epikote YX8000 | 50 | 50 | 10 | 10 | 10 | 65 | 65 | 65 | 50 | 50 |
|  | Hardening accelerator 2PZ (Water insolble) | 5 | 5 | 5 | 5 | 5 | 5 | 5 | 5 | — | 30 |
|  | n-propyl alcohol | 10 | 10 | 10 | 10 | 10 | 10 | 10 | 10 | 10 | 30 |
|  | Tetrahydrofuran | 190 | 105 | 115 | 145 | 180 | 115 | 145 | 180 | 140 | 150 |
|  | Light transmittance (%) | 99 | 99 | 99 | 99 | 99 | 99 | 99 | 99 | 99 | 99 |
|  | Biaxially stretched polypropylene film (N/m) | 13 | 15 | 13 | 12 | 12 | 20 | 19 | 16 | 15 | 13 |
|  | Unstretched polypropylene film (N/m) | 19 | 23 | 16 | 15 | 13 | 24 | 24 | 22 | 22 | 22 |
| Lamination Process | Delamination | ○ | ○ | x | x | x | x | ○ | ○ | ○ | ○ |
|  | Flexibility | x | ○ | x | x | x | x | ○ | ○ | ○ | x |
|  | Laminatability | x | ○ | ○ | ○ | x | ○ | ○ | ○ | ○ | x |
| Dicing Process | Alignment mark detectability | ○ | ○ | ○ | ○ | ○ | ○ | ○ | ○ | ○ | ○ |
|  | Dicing processability (Stain resistance) | ○ | x | ○ | ○ | ○ | x | x | x | x | x |
|  | Dicing processability (Defect formation resistance) | x | x | x | x | x | x | x | x | x | x |
| Bonding Process | Alignment mark detectability | ○ | ○ | ○ | ○ | ○ | ○ | ○ | ○ | ○ | ○ |
|  | Electric connectivity | x | ○ | ○ | ○ | x | ○ | ○ | ○ | ○ | x |
| Electric connectivity evaluation | Initial electirc connectivity | 15/20 | 15/20 | 15/20 | 15/20 | 15/20 | 15/20 | 15/20 | 15/20 | 20/20 | 20/20 |
|  | Electric connectivity after the heat impact test | 20/20 | 20/20 | 20/20 | 20/20 | 20/20 | 20/20 | 20/20 | 20/20 | 20/20 | 20/20 |
| Semiconductor device evaluation | Liquid crystal panel displaying test | x | x | x | x | x | x | x | x | x | x |

TABLE 7

|  |  | Examples |  |  |  |  |  |  |  |  |  |  |
|---|---|---|---|---|---|---|---|---|---|---|---|---|
|  |  | 39 | 40 | 41 | 42 | 43 | 44 | 45 | 46 | 47 | 48 | 49 |
| Adhesive composition (Weight parts) | Organic-solvent-soluble polyimide A | 20 | 30 | 50 | 50 | 65 | 85 | 20 | 30 | 50 | 65 | 85 |
|  | Solid epoxy compound Epikote 157S70 | 50 | 50 | 50 | 50 | 50 | 50 | 80 | 80 | 80 | 80 | 80 |
|  | Liquid epoxy compound Epikote 828 | 50 | 50 | 50 | 50 | 50 | 50 | 20 | 20 | 20 | 20 | 20 |
|  | Hardening accelerator 2PZ (Water insoluble) | 3 | 3 | 3 | — | 3 | 3 | 3 | 3 | 3 | 3 | 3 |
|  | Hardening accelerator 2E4MZ (water solble) | — | — | — | 3 | — | — | — | — | — | — | — |
|  | n-propyl alcohol | 10 | 10 | 10 | 10 | 10 | 10 | 10 | 10 | 10 | 10 | 10 |
|  | Methyl ethyl ketone | 95 | 125 | 145 | 145 | 160 | 180 | 95 | 125 | 145 | 160 | 180 |
|  | Light transmittance (%) | 99 | 99 | 99 | 99 | 99 | 99 | 99 | 99 | 99 | 99 | 99 |
|  | Biaxially stretched polypropylene film (N/m) | 6 | 6 | 4 | 4 | 4 | 4 | 2 | 2 | 2 | 2 | 2 |
|  | Unstretched polypropylene film (N/m) | 14 | 14 | 10 | 10 | 10 | 10 | 9 | 8 | 8 | 8 | 8 |
| Lamination Process | Delamination | ○ | ○ | ○ | ○ | ○ | ○ | ○ | ○ | ○ | ○ | ○ |
|  | Flexibility | ○ | ○ | ○ | ○ | ○ | ○ | ○ | ○ | ○ | ○ | x |
|  | Laminatability | ○ | ○ | ○ | ○ | ○ | ○ | ○ | ○ | ○ | ○ | ○ |

TABLE 7-continued

| | | | | | | | | | | | | |
|---|---|---|---|---|---|---|---|---|---|---|---|---|
| Dicing Process | Alignment mark detectability | ○ | ○ | ○ | ○ | ○ | ○ | ○ | ○ | ○ | ○ | ○ |
| | Dicing processability (Stain resistance) | ○ | ○ | ○ | ○ | ○ | ○ | ○ | ○ | ○ | ○ | ○ |
| | Dicing processability (Defect formation resistance) | x | ○ | ○ | ○ | ○ | x | x | x | x | x | x |
| Bonding Process | Alignment mark detectability | ○ | ○ | ○ | ○ | ○ | ○ | ○ | ○ | ○ | ○ | ○ |
| | Electric connectivity | ○ | ○ | ○ | ○ | ○ | ○ | ○ | ○ | ○ | ○ | ○ |
| Electric connectivity evaluation | Initial electirc connectivity | 1/20 | 0/20 | 0/20 | 2/20 | 0/20 | 1/20 | 1/20 | 1/20 | 1/20 | 1/20 | 1/20 |
| | Electric connectivity after the heat impact test | 0/20 | 0/20 | 0/20 | 0/20 | 0/20 | 0/20 | 0/20 | 0/20 | 0/20 | 0/20 | 0/20 |
| Semiconductor device evaluation | Liquid crystal panel displaying test | ○ | ○ | ○ | ○ | ○ | ○ | ○ | ○ | ○ | ○ | ○ |

| | | Examples | | | | | | | | | |
|---|---|---|---|---|---|---|---|---|---|---|---|
| | | 50 | 51 | 52 | 53 | 54 | 55 | 56 | 57 | 58 | 59 |
| Adhesive composition (Weight parts) | Organic-solvent-soluble polyimide A | 20 | 30 | 50 | 65 | 85 | 0 | 30 | 50 | 65 | 85 |
| | Solid epoxy compound Epikote 157S70 | 70 | 70 | 70 | 70 | 70 | 40 | 40 | 40 | 40 | 40 |
| | Liquid epoxy compound Epikote 828 | 30 | 30 | 30 | 30 | 30 | 60 | 60 | 60 | 60 | 60 |
| | Hardening accelerator 2PZ (Water insolble) | 3 | 3 | 3 | 3 | 3 | 3 | 3 | 3 | 3 | 3 |
| | Hardening accelerator 2E4MZ (water solble) | — | — | — | — | — | — | — | — | — | — |
| | n-propyl alcohol | 10 | 10 | 10 | 10 | 10 | 10 | 10 | 10 | 10 | 10 |
| | Methyl ethyl ketone | 95 | 125 | 145 | 160 | 180 | 95 | 125 | 145 | 160 | 180 |
| | Light transmittance (%) | 99 | 99 | 99 | 99 | 99 | 99 | 99 | 99 | 99 | 99 |
| | Biaxially stretched polypropylene film (N/m) | 4 | 4 | 4 | 4 | 4 | 8 | 8 | 6 | 6 | 6 |
| | Unstretched polypropylene film (N/m) | 10 | 10 | 10 | 10 | 10 | 15 | 15 | 15 | 13 | 13 |
| Lamination Process | Delamination | ○ | ○ | ○ | ○ | ○ | ○ | ○ | ○ | ○ | ○ |
| | Flexibility | ○ | ○ | ○ | ○ | ○ | ○ | ○ | ○ | ○ | ○ |
| | Laminatability | ○ | ○ | ○ | ○ | ○ | ○ | ○ | ○ | ○ | ○ |
| Dicing Process | Alignment mark detectability | ○ | ○ | ○ | ○ | ○ | ○ | ○ | ○ | ○ | ○ |
| | Dicing processability (Stain resistance) | ○ | ○ | ○ | ○ | ○ | x | x | x | x | ○ |
| | Dicing processability (Defect formation resistance) | x | ○ | ○ | ○ | x | ○ | ○ | ○ | ○ | x |
| Bonding Process | Alignment mark detectability | ○ | ○ | ○ | ○ | ○ | ○ | ○ | ○ | ○ | ○ |
| | Electric connectivity | ○ | ○ | ○ | ○ | ○ | ○ | ○ | ○ | ○ | ○ |
| Electric connectivity evaluation | Initial electirc connectivity | 1/20 | 0/20 | 0/20 | 0/20 | 1/20 | 1/20 | 1/20 | 1/20 | 1/20 | 1/20 |
| | Electric connectivity after the heat impact test | 0/20 | 0/20 | 0/20 | 0/20 | 0/20 | 0/20 | 0/20 | 0/20 | 0/20 | 0/20 |
| Semiconductor device evaluation | Liquid crystal panel displaying test | ○ | ○ | ○ | ○ | ○ | ○ | ○ | ○ | ○ | ○ |

TABLE 8

| | | Comparative examples | | | | | |
|---|---|---|---|---|---|---|---|
| | | 27 | 28 | 29 | 30 | 31 | 32 |
| Adhesive composition (Weight parts) | Organic-solvent-soluble polyimide A | 95 | 10 | 50 | 40 | 50 | 50 |
| | Solid epoxy compound Epikote 157S70 | 50 | 50 | 90 | 35 | 50 | 50 |
| | Liquid epoxy compound Epikote 828 | 50 | 50 | 10 | 65 | 50 | 50 |
| | Hardening accelerator 2PZ (Water insolble) | 3 | 3 | 3 | 3 | — | 30 |
| | Hardening accelerator 2E4MZ (water solble) | — | — | — | — | — | — |
| | n-propyl alcohol | 10 | 10 | 10 | 10 | 10 | 30 |
| | Methyl ethyl ketone | 190 | 105 | 145 | 145 | 140 | 150 |
| | Light transmittance (%) | 99 | 99 | 99 | 99 | 99 | 97 |
| | Biaxially stretched polypropylene film (N/m) | 3 | 5 | 3 | 7 | 5 | 4 |
| | Unstretched polypropylene film (N/m) | 9 | 13 | 9 | 14 | 14 | 14 |
| Lamination Process | Delamination | ○ | ○ | ○ | ○ | ○ | ○ |
| | Flexibility | x | ○ | x | ○ | ○ | x |
| | Laminatability | x | ○ | ○ | ○ | ○ | x |
| Dicing Process | Alignment mark detectability | ○ | ○ | ○ | ○ | ○ | ○ |
| | Dicing processability (Stain resistance) | ○ | x | ○ | x | x | x |
| | Dicing processability (Defect formation resistance) | x | x | x | x | x | x |

TABLE 8-continued

|  |  | Comparative examples ||||||
|---|---|---|---|---|---|---|---|
|  |  | 27 | 28 | 29 | 30 | 31 | 32 |
| Bonding Process | Alignment mark detectability | ○ | ○ | ○ | ○ | ○ | ○ |
|  | Electric connectivity | x | ○ | ○ | ○ | ○ | x |
| Electric connectivity evaluation | Initial electirc connectivity | 13/20 | 15/20 | 10/20 | 10/20 | 20/20 | 20/20 |
|  | Electric connectivity after the heat impact test | 20/20 | 20/20 | 20/20 | 20/20 | 20/20 | 20/20 |
| Semiconductor device evaluation | Liquid crystal panel displaying test | x | x | x | x | x | x |

TABLE 9

|  |  | Examples |||||||||||
|---|---|---|---|---|---|---|---|---|---|---|---|
|  |  | 60 | 61 | 62 | 63 | 64 | 65 | 66 | 67 | 68 | 69 | 70 |
| Adhesive composition (Weight parts) | Organic-solvent-soluble polyimide B | 20 | 30 | 50 | 50 | 65 | 85 | 20 | 30 | 50 | 65 | 85 |
|  | Solid epoxy compound Epikote 157S70 | 50 | 50 | 50 | 50 | 50 | 50 | 80 | 80 | 80 | 80 | 80 |
|  | Liquid epoxy compound Epikote 828 | 50 | 50 | 50 | 50 | 50 | 50 | 20 | 20 | 20 | 20 | 20 |
|  | Hardening accelerator 2PZ (Water insolble) | 3 | 3 | 3 | — | 3 | 3 | 3 | 3 | 3 | 3 | 3 |
|  | Hardening accelerator 2E4MZ (water solble) | — | — | — | 3 | — | — | — | — | — | — | — |
|  | n-propyl alcohol | 10 | 10 | 10 | 10 | 10 | 10 | 10 | 0 | 10 | 10 | 10 |
|  | Methyl ethyl ketone | 95 | 125 | 145 | 145 | 160 | 180 | 95 | 125 | 145 | 160 | 180 |
| Light transmittance (%) |  | 99 | 99 | 99 | 99 | 99 | 99 | 99 | 99 | 99 | 99 | 99 |
| Biaxially stretched polypropylene film (N/m) |  | 6 | 6 | 4 | 4 | 4 | 4 | 3 | 3 | 3 | 3 | 3 |
| Unstretchad polypropylene film (N/m) |  | 15 | 15 | 10 | 10 | 10 | 10 | 10 | 9 | 9 | 9 | 9 |
| Lamination Process | Delamination | ○ | ○ | ○ | ○ | ○ | ○ | ○ | ○ | ○ | ○ | ○ |
|  | Flexibility | ○ | ○ | ○ | ○ | ○ | ○ | ○ | ○ | ○ | ○ | x |
|  | Laminatability | ○ | ○ | ○ | ○ | ○ | ○ | ○ | ○ | ○ | ○ | ○ |
| Dicing Process | Alignment mark detectability | ○ | ○ | ○ | ○ | ○ | ○ | ○ | ○ | ○ | ○ | ○ |
|  | Dicing processability (Stain resistance) | ○ | ○ | ○ | ○ | ○ | ○ | ○ | ○ | ○ | ○ | ○ |
|  | Dicing processability (Defect formation resistance) | x | ○ | ○ | ○ | ○ | x | x | x | x | x | x |
| Bonding Process | Alignment mark detectability | ○ | ○ | ○ | ○ | ○ | ○ | ○ | ○ | ○ | ○ | ○ |
|  | Electric connectivity | ○ | ○ | ○ | ○ | ○ | ○ | ○ | ○ | ○ | ○ | ○ |
| Electric connectivity evaluation | Initial electirc connectivity | 1/20 | 0/20 | 0/20 | 2/20 | 0/20 | 1/20 | 1/20 | 1/20 | 1/20 | 1/20 | 1/20 |
|  | Electric connectivity after the heat impact test | 0/20 | 0/20 | 0/20 | 0/20 | 0/20 | 0/20 | 0/20 | 0/20 | 0/20 | 0/20 | 0/20 |
| Semiconductor device evaluation | Liquid crystal panel displaying test | ○ | ○ | ○ | ○ | ○ | ○ | ○ | ○ | ○ | ○ | ○ |

|  |  | Examples |||||||||| 
|---|---|---|---|---|---|---|---|---|---|---|
|  |  | 71 | 72 | 73 | 74 | 75 | 76 | 77 | 78 | 79 | 80 |
| Adhesive composition (Weight parts) | Organic-solvent-soluble polyimide B | 20 | 30 | 50 | 5 | 85 | 20 | 30 | 50 | 65 | 85 |
|  | Solid epoxy compound Epikote 157S70 | 70 | 70 | 70 | 70 | 70 | 40 | 40 | 40 | 40 | 40 |
|  | Liquid epoxy compound Epikote 828 | 30 | 30 | 30 | 30 | 30 | 60 | 60 | 60 | 60 | 60 |
|  | Hardening accelerator 2PZ (Water insolble) | 3 | 3 | 3 | 3 | 3 | 3 | 3 | 3 | 3 | 3 |
|  | Hardening accelerator 2E4MZ (water solble) | — | — | — | — | — | — | — | — | — | — |
|  | n-propyl alcohol | 10 | 10 | 0 | 10 | 10 | 10 | 10 | 10 | 10 | 10 |
|  | Methyl ethyl ketone | 95 | 125 | 145 | 160 | 180 | 95 | 125 | 145 | 160 | 180 |
| Light transmittance (%) |  | 99 | 99 | 99 | 99 | 99 | 99 | 99 | 99 | 99 | 99 |
| Biaxially stretched polypropylene film (N/m) |  | 4 | 4 | 4 | 4 | 4 | 8 | 8 | 6 | 6 | 6 |
| Unstretchad polypropylene film (N/m) |  | 10 | 10 | 10 | 10 | 10 | 15 | 15 | 15 | 13 | 13 |
| Lamination Process | Delamination | ○ | ○ | ○ | ○ | ○ | ○ | ○ | ○ | ○ | ○ |
|  | Flexibility | ○ | ○ | ○ | ○ | ○ | ○ | ○ | ○ | ○ | ○ |
|  | Laminatability | ○ | ○ | ○ | ○ | ○ | ○ | ○ | ○ | ○ | ○ |
| Dicing Process | Alignment mark detectability | ○ | ○ | ○ | ○ | ○ | ○ | ○ | ○ | ○ | ○ |

TABLE 9-continued

|  |  |  |  |  |  |  |  |  |  |  |  |
|---|---|---|---|---|---|---|---|---|---|---|---|
|  | Dicing processability (Stain resistance) | ○ | ○ | ○ | ○ | ○ | x | x | x | x | ○ |
|  | Dicing processability (Defect formation resistance) | x | ○ | ○ | ○ | x | ○ | ○ | ○ | ○ | x |
| Bonding Process | Alignment mark detectability | ○ | ○ | ○ | ○ | ○ | ○ | ○ | ○ | ○ | ○ |
|  | Electric connectivity | ○ | ○ | ○ | ○ | ○ | ○ | ○ | ○ | ○ | ○ |
| Electric connectivity evaluation | Initial electirc connectivity | 1/20 | 0/20 | 0/20 | 0/20 | 1/20 | 1/20 | 1/20 | 1/20 | 1/20 | 1/20 |
|  | Electric connectivity after the heat impact test | 0/20 | 0/20 | 0/20 | 0/20 | 0/20 | 0/20 | 0/20 | 0/20 | 0/20 | 0/20 |
| Semiconductor device evaluation | Liquid crystal panel displaying test | ○ | ○ | ○ | ○ | ○ | ○ | ○ | ○ | ○ | ○ |

TABLE 10

|  |  | Comparative examples ||||||
|---|---|---|---|---|---|---|---|
|  |  | 33 | 34 | 35 | 36 | 37 | 38 |
| Adhesive composition (Weight parts) | Organic-solvent-soluble polyimide B | 95 | 10 | 50 | 50 | 50 | 50 |
|  | Solid epoxy compound Epikote 157S70 | 50 | 50 | 90 | 35 | 50 | 50 |
|  | Liquid epoxy compound Epikote 828 | 50 | 50 | 10 | 65 | 50 | 50 |
|  | Hardening accelerator 2PZ (Water insolble) | 3 | 3 | 3 | 3 | — | 30 |
|  | Hardening accelerator 2E4MZ (water solble) | — | — | — | — | — | — |
|  | n-propyl alcohol | 10 | 10 | 10 | 10 | 10 | 30 |
|  | Methyl ethyl ketone | 190 | 105 | 145 | 145 | 140 | 150 |
|  | Light transmittance (%) | 99 | 99 | 99 | 99 | 99 | 97 |
| Biaxially stretched polypropylene film (N/m) |  | 3 | 5 | 3 | 7 | 5 | 4 |
| Unstretched polypropylene film (N/m) |  | 9 | 13 | 9 | 14 | 14 | 14 |
| Lamination Process | Delamination | ○ | ○ | ○ | ○ | ○ | ○ |
|  | Flexibility | x | ○ | x | ○ | ○ | x |
|  | Laminatability | x | ○ | ○ | ○ | ○ | x |
| Dicing Process | Alignment mark detectability | ○ | ○ | ○ | ○ | ○ | ○ |
|  | Dicing processability (Stain resistance) | ○ | x | ○ | x | x | x |
|  | Dicing processability (Defect formation resistance) | x | x | x | x | x | x |
| Bonding Process | Alignment mark detectability | ○ | ○ | ○ | ○ | ○ | ○ |
|  | Electric connectivity | x | ○ | ○ | ○ | ○ | x |
| Electric connectivity evaluation | Initial electirc connectivity | 13/20 | 15/20 | 10/20 | 10/20 | 20/20 | 20/20 |
|  | Electric connectivity after the heat impact test | 20/20 | 20/20 | 20/20 | 20/20 | 20/20 | 20/20 |
| Semiconductor device evaluation | Liquid crystal panel displaying test | x | x | x | x | x | x |

TABLE 11

|  |  | Examples |||||||||||
|---|---|---|---|---|---|---|---|---|---|---|---|
|  |  | 81 | 82 | 83 | 84 | 85 | 86 | 87 | 88 | 89 | 90 | 91 |
| Adhesive composition (Weight parts) | Organic-solvent-soluble polyimide C | 20 | 30 | 50 | 50 | 65 | 85 | 20 | 30 | 50 | 65 | 85 |
|  | Solid epoxy compound Epikote 157S70 | 50 | 50 | 50 | 50 | 50 | 50 | 80 | 80 | 80 | 80 | 80 |
|  | Liquid epoxy compound Epikote 828 | 50 | 50 | 50 | 50 | 50 | 50 | 20 | 20 | 20 | 20 | 20 |
|  | Hardening accelerator 2PZ (Water insoluble) | 3 | 3 | 3 | — | 3 | 3 | 3 | 3 | 3 | 3 | 3 |
|  | Hardening accelerator 2E4MZ (water solble) | — | — | — | 3 | — | — | — | — | — | — | — |
|  | n-propyl alcohol | 10 | 10 | 10 | 10 | 10 | 10 | 10 | 10 | 10 | 10 | 10 |
|  | Methyl ethyl ketone | 95 | 125 | 145 | 145 | 160 | 180 | 95 | 125 | 145 | 160 | 180 |
| Light transmittance (%) |  | 99 | 99 | 99 | 99 | 99 | 99 | 99 | 99 | 99 | 99 | 99 |
| Biaxially stretched polypropylene film (N/m) |  | 6 | 6 | 4 | 4 | 4 | 4 | 3 | 3 | 3 | 3 | 3 |
| Unstretched polypropylene film (N/m) |  | 15 | 15 | 10 | 10 | 10 | 10 | 10 | 9 | 9 | 9 | 9 |
| Lamination Process | Delamination | ○ | ○ | ○ | ○ | ○ | ○ | ○ | ○ | ○ | ○ | ○ |
|  | Flexibility | ○ | ○ | ○ | ○ | ○ | ○ | ○ | ○ | ○ | ○ | x |
|  | Laminatability | ○ | ○ | ○ | ○ | ○ | ○ | ○ | ○ | ○ | ○ | ○ |
| Dicing Process | Alignment mark detectability | ○ | ○ | ○ | ○ | ○ | ○ | ○ | ○ | ○ | ○ | ○ |
|  | Dicing processability (Stain resistance) | ○ | ○ | ○ | ○ | ○ | ○ | ○ | ○ | ○ | ○ | ○ |

TABLE 11-continued

|  |  |  |  |  |  |  |  |  |  |  |  |
|---|---|---|---|---|---|---|---|---|---|---|---|
|  | Dicing processability (Defect formation resistance) | x | o | o | o | o | x | x | x | x | x | x |
| Bonding Process | Alignment mark detectability | o | o | o | o | o | o | o | o | o | o | o |
|  | Electric connectivity | o | o | o | o | o | o | o | o | o | o | o |
| Electric connectivity evaluation | Initial electirc connectivity | 1/20 | 0/20 | 0/20 | 2/20 | 0/20 | 1/20 | 1/20 | 1/20 | 1/20 | 1/20 | 1/20 |
|  | Electric connectivity after the heat impact test | 0/20 | 0/20 | 0/20 | 0/20 | 0/20 | 0/20 | 0/20 | 0/20 | 0/20 | 0/20 | 0/20 |
| Semiconductor device evaluation | Liquid crystal panel displaying test | o | o | o | o | o | o | o | o | o | o | o |

|  |  | Examples |  |  |  |  |  |  |  |  |  |
|---|---|---|---|---|---|---|---|---|---|---|---|
|  |  | 92 | 93 | 94 | 95 | 96 | 97 | 98 | 99 | 100 | 101 |
| Adhesive composition (Weight parts) | Organic-solvent-soluble polyimide C | 20 | 30 | 50 | 65 | 85 | 20 | 30 | 50 | 5 | 85 |
|  | Solid epoxy compound Epikote 157S70 | 70 | 70 | 70 | 70 | 70 | 40 | 40 | 40 | 40 | 40 |
|  | Liquid epoxy compound Epikote 828 | 30 | 30 | 30 | 30 | 30 | 60 | 60 | 60 | 60 | 60 |
|  | Hardening accelerator 2PZ (Water insolble) | 3 | 3 | 3 | 3 | 3 | 3 | 3 | 3 | 3 | 3 |
|  | Hardening accelerator 2E4MZ (water solble) | — | — | — | — | — | — | — | — | — | — |
|  | n-propyl alcohol | 10 | 10 | 10 | 10 | 10 | 10 | 10 | 10 | 10 | 10 |
|  | Methyl ethyl ketone | 95 | 125 | 145 | 160 | 180 | 95 | 125 | 145 | 160 | 180 |
|  | Light transmittance (%) | 99 | 99 | 99 | 99 | 99 | 99 | 99 | 99 | 99 | 99 |
| Biaxially stretched polypropylene film (N/m) |  | 4 | 4 | 4 | 4 | 4 | 8 | 8 | 6 | 6 | 6 |
| Unstretched polypropylene film (N/m) |  | 10 | 10 | 10 | 10 | 10 | 15 | 15 | 15 | 13 | 13 |
| Lamination Process | Delamination | o | o | o | o | o | o | o | o | o | o |
|  | Flexibility | o | o | o | o | o | o | o | o | o | o |
|  | Laminatability | o | o | o | o | o | o | o | o | o | o |
| Dicing Process | Alignment mark detectability | o | o | o | o | o | o | o | o | o | o |
|  | Dicing processability (Stain resistance) | o | o | o | o | o | x | x | x | x | o |
|  | Dicing processability (Defect formation resistance) | x | o | o | o | x | o | o | o | o | x |
| Bonding Process | Alignment mark detectability | o | o | o | o | o | o | o | o | o | o |
|  | Electric connectivity | o | o | o | o | o | o | o | o | o | o |
| Electric connectivity evaluation | Initial electirc connectivity | 1/20 | 0/20 | 0/20 | 0/20 | 1/20 | 1/20 | 1/20 | 1/20 | 1/20 | 1/20 |
|  | Electric connectivity after the heat impact test | 0/20 | 0/20 | 0/20 | 0/20 | 0/20 | 0/20 | 0/20 | 0/20 | 0/20 | 0/20 |
| Semiconductor device evaluation | Liquid crystal panel displaying test | o | o | o | o | o | o | o | o | o | o |

TABLE 12

|  |  | Comparative examples |  |  |  |  |  |
|---|---|---|---|---|---|---|---|
|  |  | 39 | 40 | 41 | 42 | 43 | 44 |
| Adhesive composition (Weight parts) | Organic-solvent-soluble polyimide C | 95 | 10 | 50 | 50 | 50 | 50 |
|  | Solid epoxy compound Epikote 157S70 | 50 | 50 | 90 | 35 | 50 | 50 |
|  | Liquid epoxy compound Epikote 828 | 50 | 50 | 10 | 65 | 50 | 50 |
|  | Hardening accelerator 2PZ (Water insolble) | 3 | 3 | 3 | 3 | — | 30 |
|  | Hardening accelerator 2E4MZ (water solble) | — | — | — | — | — | — |
|  | n-propyl alcohol | 10 | 10 | 10 | 10 | 10 | 30 |
|  | Methyl ethyl ketone | 190 | 105 | 145 | 145 | 140 | 150 |
|  | Light transmittance (%) | 99 | 99 | 99 | 99 | 99 | 97 |
| Biaxially stretched polypropylene film (N/m) |  | 3 | 5 | 3 | 7 | 5 | 7 |
| Unstretched polypropylene film (N/m) |  | 9 | 13 | 9 | 14 | 14 | 14 |
| Lamination Process | Delamination | o | o | o | o | o | o |
|  | Flexibility | x | o | x | o | o | x |
|  | Laminatability | x | o | o | o | o | x |
| Dicing Process | Alignment mark detectability | o | o | o | o | o | o |
|  | Dicing processability (Stain resistance) | o | x | o | x | x | x |
|  | Dicing processability (Defect formation resistance) | x | x | x | x | x | x |
| Bonding Process | Alignment mark detectability | o | o | o | o | o | o |
|  | Electric connectivity | x | o | o | o | o | x |
| Electric connectivity evaluation | Initial electirc connectivity | 13/20 | 15/20 | 10/20 | 10/20 | 20/20 | 20/20 |
|  | Electric connectivity after the heat impact test | 20/20 | 20/20 | 20/20 | 20/20 | 20/20 | 20/20 |

TABLE 12-continued

|  |  | Comparative examples ||||||
|---|---|---|---|---|---|---|---|
|  |  | 39 | 40 | 41 | 42 | 43 | 44 |
| Semiconductor device evaluation | Liquid crystal panel displaying test | x | x | x | x | x | x |

TABLE 13

|  |  | Examples ||||||||||
|---|---|---|---|---|---|---|---|---|---|---|---|
|  |  | 102 | 103 | 104 | 105 | 106 | 107 | 108 | 109 | 110 | 111 |
| Adhesive composition (Weight parts) | Organic-solvent-soluble polyimide A | 20 | 30 | 0 | 65 | 85 | 20 | 30 | 50 | 65 | 85 |
|  | Solid epoxy compound Epikote 157S70 | 50 | 50 | 50 | 50 | 50 | 80 | 80 | 80 | 80 | 80 |
|  | Liquid epoxy compound Epikote 828 | 50 | 50 | 50 | 50 | 50 | 20 | 20 | 20 | 20 | 20 |
|  | Hardening accelerator 2PZ (Water insolble) | 10 | 10 | 10 | 10 | 10 | 10 | 10 | 10 | 10 | 10 |
|  | n-propyl alcohol | 10 | 10 | 10 | 10 | 10 | 10 | 10 | 10 | 10 | 10 |
|  | Methyl ethyl ketone | 95 | 125 | 145 | 160 | 180 | 95 | 125 | 145 | 160 | 180 |
|  | Light transmittance (%) | 99 | 99 | 99 | 99 | 99 | 99 | 99 | 99 | 99 | 99 |
|  | Biaxially stretched polypropylene film (N/m) | 6 | 6 | 4 | 4 | 4 | 2 | 2 | 2 | 2 | 2 |
|  | Unstretched polypropylene film (N/m) | 14 | 14 | 10 | 10 | 10 | 9 | 8 | 8 | 8 | 8 |
| Lamination Process | Delamination | ○ | ○ | ○ | ○ | ○ | ○ | ○ | ○ | ○ | ○ |
|  | Flexibility | ○ | ○ | ○ | ○ | ○ | ○ | ○ | ○ | ○ | x |
|  | Laminatability | ○ | ○ | ○ | ○ | ○ | ○ | ○ | ○ | ○ | ○ |
| Dicing Process | Alignment mark detectability | ○ | ○ | ○ | ○ | ○ | ○ | ○ | ○ | ○ | ○ |
|  | Dicing processability (Stain resistance) | ○ | ○ | ○ | ○ | ○ | ○ | ○ | ○ | ○ | ○ |
|  | Dicing processability (Defect formation resistance) | x | ○ | ○ | ○ | x | x | x | x | x | x |
| Bonding Process | Alignment mark detectability | ○ | ○ | ○ | ○ | ○ | ○ | ○ | ○ | ○ | ○ |
|  | Electric connectivity | ○ | ○ | ○ | ○ | ○ | ○ | ○ | ○ | ○ | ○ |
| Electric connectivity evaluation | Initial electirc connectivity | 1/20 | 0/20 | 0/20 | 0/20 | 1/20 | 1/20 | 1/20 | 1/20 | 1/20 | 1/20 |
|  | Electric connectivity after the heat impact test | 0/20 | 0/20 | 0/20 | 0/20 | 0/20 | 0/20 | 0/20 | 0/20 | 0/20 | 0/20 |
| Semiconductor device evaluation | Liquid crystal panel displaying test | ○ | ○ | ○ | ○ | ○ | ○ | ○ | ○ | ○ | ○ |

|  |  | Examples |||||||||||
|---|---|---|---|---|---|---|---|---|---|---|---|
|  |  | 112 | 113 | 114 | 115 | 116 | 117 | 118 | 119 | 120 | 121 |
| Adhesive composition (Weight parts) | Organic-solvent-soluble polyimide A | 20 | 30 | 50 | 65 | 85 | 20 | 30 | 50 | 65 | 85 |
|  | Solid epoxy compound Epikote 157S70 | 70 | 70 | 70 | 70 | 70 | 40 | 40 | 40 | 40 | 40 |
|  | Liquid epoxy compound Epikote 828 | 30 | 30 | 30 | 30 | 30 | 60 | 60 | 60 | 60 | 60 |
|  | Hardening accelerator 2PZ (Water insolble) | 10 | 10 | 10 | 10 | 10 | 10 | 10 | 10 | 10 | 10 |
|  | n-propyl alcohol | 10 | 10 | 10 | 10 | 10 | 10 | 10 | 10 | 10 | 10 |
|  | Methyl ethyl ketone | 95 | 125 | 145 | 160 | 180 | 95 | 125 | 145 | 160 | 180 |
|  | Light transmittance (%) | 99 | 99 | 99 | 99 | 99 | 99 | 99 | 99 | 99 | 99 |
|  | Biaxially stretched polypropylene film (N/m) | 4 | 4 | 4 | 4 | 4 | 8 | 8 | 6 | 6 | 6 |
|  | Unstretched polypropylene film (N/m) | 10 | 10 | 10 | 10 | 10 | 15 | 15 | 15 | 13 | 13 |
| Lamination Process | Delamination | ○ | ○ | ○ | ○ | ○ | ○ | ○ | ○ | ○ | ○ |
|  | Flexibility | ○ | ○ | ○ | ○ | ○ | ○ | ○ | ○ | ○ | ○ |
|  | Laminatability | ○ | ○ | ○ | ○ | ○ | ○ | ○ | ○ | ○ | ○ |

TABLE 13-continued

|  |  |  |  |  |  |  |  |  |  |  |  |
|---|---|---|---|---|---|---|---|---|---|---|---|
| Dicing Process | Alignment mark detectability | o | o | o | o | o | o | o | o | o | o |
|  | Dicing processability (Stain resistance) | o | o | o | o | o | x | x | x | x | o |
|  | Dicing processability (Defect formation resistance) | x | o | o | o | x | o | o | o | o | x |
| Bonding Process | Alignment mark detectability | o | o | o | o | o | o | o | o | o | o |
|  | Electric connectivity | o | o | o | o | o | o | o | o | o | o |
| Electric connectivity evaluation | Initial electirc connectivity | 1/20 | 0/20 | 0/20 | 0/20 | 1/20 | 1/20 | 1/20 | 1/20 | 1/20 | 1/20 |
|  | Electric connectivity after the heat impact test | 0/20 | 0/20 | 0/20 | 0/20 | 0/20 | 0/20 | 0/20 | 0/20 | 0/20 | 0/20 |
| Semiconductor device evaluation | Liquid crystal panel displaying test | o | o | o | o | o | o | o | o | o | o |

TABLE 14

|  |  | Comparative examples | | | | | | | | | |
|---|---|---|---|---|---|---|---|---|---|---|---|
|  |  | 45 | 46 | 47 | 48 | 49 | 50 | 51 | 52 | 53 | 54 |
| Adhesive composition (Weight parts) | Organic-solvent-soluble polyimide A | 20 | 30 | 50 | 65 | 85 | 20 | 30 | 0 | 65 | 85 |
|  | Solid epoxy compound Epikote 157S70 | 50 | 50 | 50 | 50 | 50 | 80 | 80 | 80 | 80 | 80 |
|  | Liquid epoxy compound Epikote 828 | 50 | 50 | 50 | 50 | 50 | 20 | 20 | 20 | 20 | 20 |
|  | Hardening accelerator 2PZ (Water insolble) | 15 | 15 | 15 | 15 | 15 | 15 | 15 | 15 | 15 | 15 |
|  | n-propyl alcohol | 10 | 10 | 10 | 10 | 10 | 10 | 10 | 10 | 10 | 10 |
|  | Methyl ethyl ketone | 95 | 125 | 145 | 160 | 180 | 95 | 125 | 145 | 160 | 180 |
|  | Light transmittance (%) | 99 | 99 | 99 | 99 | 99 | 99 | 99 | 99 | 99 | 99 |
| Biaxially stretched polypropylene film (N/m) |  | 4 | 4 | 2 | 2 | 2 | 1 | 1 | 1 | 1 | 1 |
| Unstretched polypropylene film (N/m) |  | 12 | 12 | 8 | 8 | 8 | 7 | 7 | 7 | 7 | 7 |
| Lamination Process | Delamination | o | o | o | o | o | o | o | o | o | o |
|  | Flexibility | o | o | o | o | x | x | x | x | x | x |
|  | Laminatability | o | o | o | o | o | o | o | o | o | o |
| Dicing Process | Alignment mark detectability | o | o | o | o | o | o | o | o | o | o |
|  | Dicing processability (Stain resistance) | o | o | o | o | o | o | o | o | o | o |
|  | Dicing processbility (Defect formation resistance) | x | o | o | o | x | x | x | x | x | x |
| Bonding Process | Aligment mark detectability | o | o | o | o | o | o | o | o | o | o |
|  | Electric connectivity | o | o | o | o | o | o | o | o | o | o |
| Electric connectivity evaluation | Intial electric connectivity | 20/20 | 20/20 | 20/20 | 20/20 | 20/20 | 20/20 | 20/20 | 20/20 | 20/20 | 20/20 |
|  | Eletric connectivity after the heat impact test | 20/20 | 20/20 | 20/20 | 20/20 | 20/20 | 20/20 | 20/20 | 20/20 | 20/20 | 20/20 |
| Semiconductor device evaluation | Liquid crystal panel displaying test | x | x | x | x | x | x | x | x | x | x |

|  |  | Comparative examples | | | | | | | | | |
|---|---|---|---|---|---|---|---|---|---|---|---|
|  |  | 55 | 56 | 57 | 58 | 59 | 60 | 61 | 62 | 63 | 64 |
| Adhesive composition (Weight parts) | Organic-solvent-soluble polyimide A | 20 | 30 | 50 | 65 | 85 | 20 | 30 | 50 | 65 | 85 |
|  | Solid epoxy compound Epikote 157S70 | 70 | 70 | 70 | 70 | 70 | 40 | 40 | 40 | 40 | 40 |
|  | Liquid epoxy compound Epikote 828 | 30 | 30 | 30 | 30 | 30 | 60 | 60 | 60 | 60 | 60 |
|  | Hardening accelerator 2PZ (Water insolble) | 15 | 15 | 15 | 15 | 15 | 15 | 15 | 15 | 15 | 15 |
|  | n-propyl alcohol | 10 | 10 | 10 | 10 | 10 | 10 | 10 | 10 | 10 | 10 |
|  | Methyl ethyl ketone | 95 | 125 | 145 | 160 | 180 | 95 | 125 | 145 | 160 | 180 |
|  | Light transmittance (%) | 99 | 99 | 99 | 99 | 99 | 99 | 99 | 99 | 99 | 99 |
| Biaxially stretched polypropylene film (N/m) |  | 2 | 2 | 2 | 2 | 2 | 6 | 6 | 4 | 4 | 4 |
| Unstretched polypropylene film (N/m) |  | 8 | 8 | 8 | 8 | 8 | 11 | 11 | 11 | 11 | 11 |
| Lamination Process | Delamination | o | o | o | o | o | o | o | o | o | o |
|  | Flexibility | x | x | x | x | x | o | o | o | o | o |
|  | Laminatability | o | o | o | o | o | o | o | o | o | o |
| Dicing Process | Alignment mark detectability | o | o | o | o | o | o | o | o | o | o |
|  | Dicing processability (Stain resistance) | o | o | o | o | o | x | x | x | x | o |
|  | Dicing processbility (Defect formation resistance) | x | x | x | x | x | o | o | o | o | x |
| Bonding Process | Aligment mark detectability | o | o | o | o | o | o | o | o | o | o |
|  | Electric connectivity | o | o | o | o | o | o | o | o | o | o |

TABLE 14-continued

| | | | | | | | | | | | |
|---|---|---|---|---|---|---|---|---|---|---|---|
| Electric connectivity evaluation | Intial electric connectivity | 20/20 | 20/20 | 20/20 | 20/20 | 20/20 | 20/20 | 20/20 | 20/20 | 20/20 | 20/20 |
| | Eletric connectivity after the heat impact test | 20/20 | 20/20 | 20/20 | 20/20 | 20/20 | 20/20 | 20/20 | 20/20 | 20/20 | 20/20 |
| Semiconductor device evaluation | Liquid crystal panel displaying test | x | x | x | x | x | x | x | x | x | x |

TABLE 15

| | | Examples | | | | | | | | | |
|---|---|---|---|---|---|---|---|---|---|---|---|
| | | 122 | 123 | 124 | 125 | 126 | 127 | 128 | 129 | 130 | 131 |
| Adhesive composition (Weight parts) | Organic-solvent-soluble polyimide A | 20 | 30 | 50 | 65 | 85 | 20 | 30 | 50 | 65 | 85 |
| | Solid epoxy compound Epikote 157S70 | 50 | 50 | 50 | 50 | 50 | 80 | 80 | 80 | 80 | 80 |
| | Liquid epoxy compound Epikote 828 | 50 | 50 | 50 | 50 | 50 | 20 | 20 | 20 | 20 | 20 |
| | Hardening accelerator 2PZ (Water insolble) | 0.1 | 0.1 | 0.1 | 0.1 | 0.1 | 0.1 | 0.1 | 0.1 | 0.1 | 0.1 |
| | n-propyl alcohol | 10 | 10 | 10 | 10 | 10 | 10 | 10 | 10 | 10 | 10 |
| | Methyl ethyl ketone | 95 | 125 | 145 | 160 | 180 | 95 | 125 | 145 | 160 | 180 |
| Light transmittance (%) | | 99 | 99 | 99 | 99 | 99 | 99 | 99 | 99 | 99 | 99 |
| Biaxially stretched polypropylene film (N/m) | | 6 | 6 | 4 | 4 | 4 | 5 | 5 | 5 | 5 | 5 |
| Unstretched polypropylene film (N/m) | | 14 | 14 | 10 | 10 | 10 | 12 | 12 | 12 | 12 | 12 |
| Lamination Process | Delamination | ○ | ○ | ○ | ○ | ○ | ○ | ○ | ○ | ○ | ○ |
| | Flexibility | ○ | ○ | ○ | ○ | ○ | ○ | ○ | ○ | ○ | x |
| | Laminatability | ○ | ○ | ○ | ○ | ○ | ○ | ○ | ○ | ○ | ○ |
| Dicing Process | Alignment mark detectability | ○ | ○ | ○ | ○ | ○ | ○ | ○ | ○ | ○ | ○ |
| | Dicing processabitity (Stain resistance) | ○ | ○ | ○ | ○ | ○ | ○ | ○ | ○ | ○ | ○ |
| | Dicing processability (Defect formation resistance) | x | ○ | ○ | ○ | x | x | x | x | x | x |
| Bonding Process | Alignment mark detectability | ○ | ○ | ○ | ○ | ○ | ○ | ○ | ○ | ○ | ○ |
| | Etectric connectivity | ○ | ○ | ○ | ○ | ○ | ○ | ○ | ○ | ○ | ○ |
| Electric connectivity evaluation | Initial etectirc connectivity | 1/20 | 0/20 | 0/20 | 0/20 | 1/20 | 1/20 | 1/20 | 1/20 | 1/20 | 1/20 |
| | Electric connectivity after the heat impact test | 0/20 | 0/20 | 0/20 | 0/20 | 0/20 | 0/20 | 0/20 | 0/20 | 0/20 | 0/20 |
| Semiconductor device evaluation | Liquid crystal panel displaying test | ○ | ○ | ○ | ○ | ○ | ○ | ○ | ○ | ○ | ○ |

| | | Examples | | | | | | | | | |
|---|---|---|---|---|---|---|---|---|---|---|---|
| | | 132 | 133 | 134 | 135 | 136 | 137 | 138 | 139 | 140 | 141 |
| Adhesive composition (Weight parts) | Organic-solvent-soluble polyimide A | 20 | 30 | 50 | 65 | 85 | 20 | 30 | 50 | 65 | 85 |
| | Solid epoxy compound Epikote 157S70 | 70 | 70 | 70 | 70 | 70 | 40 | 40 | 40 | 40 | 40 |
| | Liquid epoxy compound Epikote 828 | 30 | 30 | 30 | 30 | 30 | 60 | 60 | 60 | 60 | 60 |
| | Hardening accelerator 2PZ (Water insolble) | 0.1 | 0.1 | 0.1 | 0.1 | 0.1 | 0.1 | 0.1 | 0.1 | 0.1 | 0.1 |
| | n-propyl alcohol | 10 | 10 | 10 | 10 | 10 | 10 | 10 | 10 | 10 | 10 |
| | Methyl ethyl ketone | 95 | 125 | 145 | 160 | 180 | 95 | 125 | 145 | 160 | 180 |
| Light transmittance (%) | | 99 | 99 | 99 | 99 | 99 | 99 | 99 | 99 | 99 | 99 |
| Biaxially stretched polypropylene film (N/m) | | 4 | 4 | 4 | 4 | 4 | 8 | 8 | 6 | 6 | 6 |
| Unstretched polypropylene film (N/m) | | 10 | 10 | 10 | 10 | 10 | 15 | 15 | 15 | 13 | 13 |
| Lamination Process | Delamination | ○ | ○ | ○ | ○ | ○ | ○ | ○ | ○ | ○ | ○ |
| | Flexibility | ○ | ○ | ○ | ○ | ○ | ○ | ○ | ○ | ○ | ○ |
| | Laminatability | ○ | ○ | ○ | ○ | ○ | ○ | ○ | ○ | ○ | ○ |
| Dicing Process | Alignment mark detectability | ○ | ○ | ○ | ○ | ○ | ○ | ○ | ○ | ○ | ○ |
| | Dicing processabitity (Stain resistance) | ○ | ○ | ○ | ○ | ○ | x | x | x | x | ○ |
| | Dicing processability (Defect formation resistance) | x | ○ | ○ | ○ | x | ○ | ○ | ○ | ○ | x |

TABLE 15-continued

| | | | | | | | | | | | |
|---|---|---|---|---|---|---|---|---|---|---|---|
| Bonding Process | Alignment mark detectability | o | o | o | o | o | o | o | o | o | o |
| | Electric connectivity | o | o | o | o | o | o | o | o | o | o |
| Electric connectivity evaluation | Initial electirc connectivity | 1/20 | 0/20 | 0/20 | 0/20 | 1/20 | 1/20 | 1/20 | 1/20 | 1/20 | 1/20 |
| | Electric connectivity after the heat impact test | 0/20 | 0/20 | 0/20 | 0/20 | 0/20 | 0/20 | 0/20 | 0/20 | 0/20 | 0/20 |
| Semiconductor device evaluation | Liquid crystal panel displaying test | o | o | o | o | o | o | o | o | o | o |

TABLE 16

| | | Comparative examples | | | | | | | | | |
|---|---|---|---|---|---|---|---|---|---|---|---|
| | | 65 | 66 | 67 | 68 | 69 | 70 | 71 | 72 | 73 | 74 |
| Adhesive composition (Weight parts) | Organic-solvent-soluble polyimide A | 20 | 30 | 50 | 65 | 85 | 20 | 30 | 50 | 65 | 85 |
| | Solid epoxy compound Epikote 157S70 | 50 | 50 | 50 | 50 | 50 | 80 | 80 | 80 | 80 | 80 |
| | Liquid epoxy compound Epikote 828 | 50 | 50 | 50 | 50 | 50 | 20 | 20 | 20 | 20 | 20 |
| | Hardening accelerator 2PZ (Water insolble) | — | — | — | — | — | — | — | — | — | — |
| | n-propyl alcohol | 10 | 10 | 10 | 10 | 10 | 10 | 10 | 10 | 10 | 10 |
| | Methyl ethyl ketone | 95 | 125 | 145 | 160 | 180 | 95 | 125 | 145 | 160 | 180 |
| | Light transmittance (%) | 99 | 99 | 99 | 99 | 99 | 99 | 99 | 99 | 99 | 99 |
| Biaxially stretched polypropylene film (N/m) | | 6 | 6 | 4 | 4 | 4 | 5 | 5 | 5 | 5 | 5 |
| Unstretched polypropylene film (N/m) | | 14 | 14 | 10 | 10 | 10 | 12 | 12 | 12 | 12 | 12 |
| Lamination Process | Delamination | o | o | o | o | o | o | o | o | o | o |
| | Flexibility | o | o | o | o | o | o | o | o | o | x |
| | Laminatability | o | o | o | o | o | o | o | o | o | o |
| Dicing Process | Alignment mark detectability | o | o | o | o | o | o | o | o | o | o |
| | Dicing processability (Stain resistance) | x | x | x | x | x | x | x | x | x | x |
| | Dicing processability (Defect formation resistance) | x | x | x | x | x | x | x | x | x | x |
| Bonding Process | Alignment mark detectability | o | o | o | o | o | o | o | o | o | o |
| | Electric connectivity | o | o | o | o | o | o | o | o | o | o |
| Electric connectivity evaluation | Initial electirc connectivity | 20/20 | 20/20 | 20/20 | 20/20 | 20/20 | 20/20 | 20/20 | 20/20 | 20/20 | 20/20 |
| | Electric connectivity after the heat impact test | 20/20 | 20/20 | 20/20 | 20/20 | 20/20 | 20/20 | 20/20 | 20/20 | 20/20 | 20/20 |
| Semiconductor device evaluation | Liquid crystal panel displaying test | x | x | x | x | x | x | x | x | x | x |

| | | Comparative examples | | | | | | | | | |
|---|---|---|---|---|---|---|---|---|---|---|---|
| | | 75 | 76 | 77 | 78 | 79 | 80 | 81 | 82 | 83 | 84 |
| Adhesive composition (Weight parts) | Organic-solvent-soluble polyimide A | 20 | 30 | 50 | 65 | 85 | 20 | 30 | 50 | 65 | 85 |
| | Solid epoxy compound Epikote 157S70 | 70 | 70 | 70 | 70 | 70 | 40 | 40 | 40 | 40 | 40 |
| | Liquid epoxy compound Epikote 828 | 30 | 30 | 30 | 30 | 30 | 60 | 60 | 60 | 60 | 60 |
| | Hardening accelerator 2PZ (Water insolble) | — | — | — | — | — | — | — | — | — | — |
| | n-propyl alcohol | 10 | 10 | 10 | 10 | 10 | 10 | 10 | 10 | 10 | 10 |
| | Methyl ethyl ketone | 95 | 125 | 145 | 160 | 180 | 95 | 125 | 145 | 160 | 180 |
| | Light transmittance (%) | 99 | 99 | 99 | 99 | 99 | 99 | 99 | 99 | 99 | 99 |
| Biaxially stretched polypropylene film (N/m) | | 4 | 4 | 4 | 4 | 4 | 8 | 8 | 6 | 6 | 6 |
| Unstretched polypropylene film (N/m) | | 10 | 10 | 10 | 10 | 10 | 15 | 15 | 15 | 13 | 13 |
| Lamination Process | Delamination | o | o | o | o | o | o | o | o | o | o |
| | Flexibility | o | o | o | o | o | o | o | o | o | o |
| | Laminatability | o | o | o | o | o | o | o | o | o | o |
| Dicing Process | Alignment mark detectability | o | o | o | o | o | o | o | o | o | o |
| | Dicing processability (Stain resistance) | x | x | x | x | x | x | x | x | x | x |
| | Dicing processability (Defect formation resistance) | x | x | x | x | x | x | x | x | x | x |
| Bonding Process | Alignment mark detectability | o | o | o | o | o | o | o | o | o | o |
| | Electric connectivity | o | o | o | o | o | o | o | o | o | o |
| Electric connectivity evaluation | Initial electirc connectivity | 20/20 | 20/20 | 20/20 | 20/20 | 20/20 | 20/20 | 20/20 | 20/20 | 20/20 | 20/20 |
| | Electric connectivity after the heat impact test | 20/20 | 20/20 | 20/20 | 20/20 | 20/20 | 20/20 | 20/20 | 20/20 | 20/20 | 20/20 |
| Semiconductor device evaluation | Liquid crystal panel displaying test | x | x | x | x | x | x | x | x | x | x |

TABLE 17

| | | Examples | |
| | | 142 | 143 |
|---|---|---|---|
| Adhesive composition (Weight parts) | Organic-solvent-soluble polyimide I | 50 | |
| | Organic-solvent-soluble polyimide J | | 50 |
| | Solid epoxy compound Epikote 157S70 | 50 | 50 |
| | Liquid epoxy compound Epikote 828 | 50 | 50 |
| | Hardening accelerator 2PZ (Water insolble) | 3 | 3 |
| | n-propyl alcohol | 10 | 10 |
| | Methyl ethyl ketone | 145 | 190 |
| | Light transmittance (%) | 99 | 99 |
| | Biaxially stretched polypropylene film (N/m) | 4 | 4 |
| | Unstretched polypropylene film (N/m) | 10 | 10 |
| Lamination Process | Delamination | o | o |
| | Flexibility | o | o |
| | Laminatability | o | o |
| Dicing Process | Alignment mark detectability | o | o |
| | Dicing processability (Stain resistance) | o | o |
| | Dicing processability (Defect formation resistance) | o | o |
| Bonding Process | Alignment mark detectability | o | o |
| | Electric connectivity | o | o |
| Electric connectivity evaluation | Initial electirc connectivity | 2/20 | 2/20 |
| | Electric connectivity after the heat impact test | 3/20 | 3/20 |
| Semiconductor device evaluation | Liquid crystal panel displaying test | o | o |

INDUSTRIAL APPLICABILITY

The adhesive composition for semiconductor of the present invention can preferably be used as an adhesive which directly and electrically connects semiconductor chip such as IC or LSI which is singulated by dicing to a circuit substrate such as a flexible substrate, glass/epoxy substrate, glass substrate or ceramic substrate.

The invention claimed is:

1. An adhesive composition for semiconductor comprising an organic-solvent-soluble polyimide (a), an epoxy compound (b) and a hardening accelerator (c), wherein, per 100 wt parts of the epoxy compound (b), there are contained 30 to 65 wt parts of the organic-solvent-soluble polyimide (a) and 0.1 to 10 wt parts of the hardening accelerator (c), wherein the organic-solvent-soluble polyimide (a) is a polymer which has a structure represented by any one of the general formulas (2) to (7), and is capable of reacting with the epoxy compound, wherein $R^4$ in the general formulas (2) to (7) is either a 2 to 12-valent organic group, or a structure represented by general formula (1) in an amount of 2 to 15 wt % with respect to a total amount of the polymer;

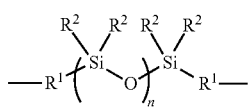

(1)

wherein in formula (1), $R^1$ is a phenylene group or an alkylene group with 1 to 5 carbons and $R^2$ is a phenyl group or an alkyl group with 1 to 5 carbons, and n denotes an integer of 1 to 10;

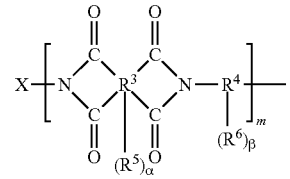

(2)

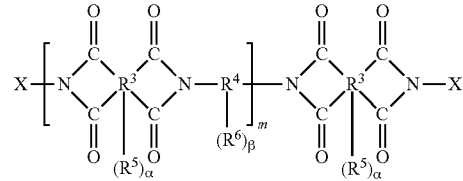

(3)

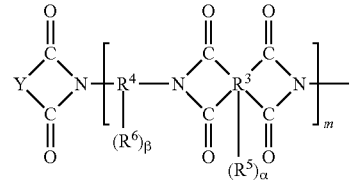

(4)

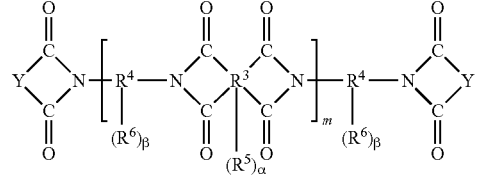

(5)

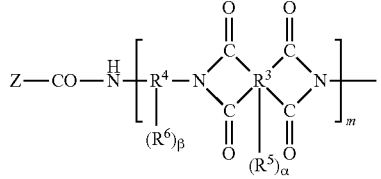

(6)

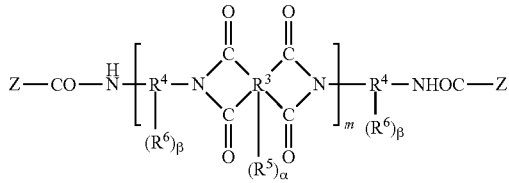

(7)

wherein, $R^3$ is a 4 to 14-valent organic group, at least one of $R^3$ and $R^4$ contains at least one group selected from the group consisting of 1,1,1,3,3,3-hexafluoropropyl group, isopropyl group, ether group, thioether group and $SO_2$ group; $R^5$ and $R^6$ denote organic groups containing at least one group selected from the group consisting of phenolic hydroxyl group, sulfonic acid group and thiol group and they may be same or different; X denotes a monovalent organic group, Y denotes a divalent organic group and Z denotes a monovalent organic group; m denotes a range of 8 to 200; α and β respectively denote an integer of 0 to 10, and α+β is an integer of 1 to 10; and the epoxy compound (b) comprises an epoxy compound that is liquid at 25° C. under $1.013 \times 10^5$ N/m² and an epoxy compound that is solid at 25° C. under $1.013 \times 10^5$ N/m², and an amount of the epoxy compound that is liquid based on all the epoxy compounds is in a range of 30 wt % or more and 50 wt % or less.

2. An adhesive composition for semiconductor according to claim 1, wherein the hardening accelerator (c) is a compound insoluble to water.

3. An adhesive composition for semiconductor according to claim 1, of which light transmittance is 70% or more.

4. An adhesive sheet material for semiconductor in which the adhesive composition for semiconductor described in claim 1 is formed on at least one surface of a plastic film, and an adhesive strength between the plastic film and said adhesive composition for semiconductor is 2 N/m or more and 49 N/m or less.

5. An adhesive sheet material for semiconductor in which a plastic film (d), the adhesive composition for semiconductor described in claim 1 and a plastic film (e) are laminated in this order, and a difference of an adhesive strength between the plastic film (e) and said adhesive composition for semiconductor and an adhesive strength between the plastic film (d) and said adhesive composition for semiconductor is 5 N/m or more.

* * * * *